(12) United States Patent
Alfieri

(10) Patent No.: US 9,015,646 B2
(45) Date of Patent: Apr. 21, 2015

(54) SYSTEM, METHOD, AND COMPUTER PROGRAM PRODUCT FOR TRANSLATING A HARDWARE LANGUAGE INTO A SOURCE DATABASE

(71) Applicant: NVIDIA Corporation, Santa Clara, CA (US)

(72) Inventor: Robert Anthony Alfieri, Chapel Hill, NC (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 13/860,463

(22) Filed: Apr. 10, 2013

(65) Prior Publication Data

US 2014/0310673 A1    Oct. 16, 2014

(51) Int. Cl.
G06F 17/50    (2006.01)

(52) U.S. Cl.
CPC .................... *G06F 17/505* (2013.01)

(58) Field of Classification Search
USPC ........................................ 716/136
See application file for complete search history.

(56) References Cited

U.S. PATENT DOCUMENTS

| | | | |
|---|---|---|---|
| 5,991,771 A | 11/1999 | Falls et al. | |
| 6,044,394 A | 3/2000 | Cadden et al. | |
| 6,106,575 A | 8/2000 | Hardwick | |
| 6,110,218 A | 8/2000 | Jennings | |
| 6,151,618 A | 11/2000 | Wahbe et al. | |
| 6,192,365 B1 | 2/2001 | Draper et al. | |
| 6,344,852 B1 | 2/2002 | Zhu et al. | |
| 6,360,191 B1 | 3/2002 | Koza et al. | |
| 6,393,386 B1 | 5/2002 | Zager et al. | |
| 6,421,808 B1 | 7/2002 | McGeer et al. | |
| 6,611,952 B1 | 8/2003 | Prakash et al. | |
| 6,625,797 B1 | 9/2003 | Edwards et al. | |
| 6,691,301 B2 | 2/2004 | Bowen | |
| 6,745,384 B1 | 6/2004 | Biggerstaff | |
| 6,836,877 B1 | 12/2004 | Dupenloup | |
| 6,876,362 B1 | 4/2005 | Newhall, Jr. et al. | |
| 6,990,438 B1 | 1/2006 | Chowdhury et al. | |
| 7,007,261 B1 | 2/2006 | Ballagh et al. | |
| 7,024,660 B2 | 4/2006 | Andrade et al. | |
| 7,058,562 B2 | 6/2006 | Powell | |
| 7,143,387 B2 * | 11/2006 | Fields et al. | ............... 716/102 |
| 7,159,183 B1 | 1/2007 | Kudukoli et al. | |
| 7,181,714 B2 | 2/2007 | Imai | |
| 7,240,335 B2 | 7/2007 | Angel et al. | |
| 7,313,773 B1 | 12/2007 | Braun et al. | |

(Continued)

OTHER PUBLICATIONS

U.S. Appl. No. 13/844,330, filed Mar. 15, 2013.

(Continued)

*Primary Examiner* — Thuan Do
*Assistant Examiner* — Mohammed Alam
(74) *Attorney, Agent, or Firm* — Zilka-Kotab, PC

(57) ABSTRACT

A system, method, and computer program product are provided for translating a hardware design. In use, a hardware design is received that is encoded as one or more data flows and one or more control constructs. A node is generated for each data flow of the one or more data flows and for each control construct of the one or more control constructs. Additionally, connectivity of the nodes is determined to generate a graph-based intermediate representation of the hardware design and the graph-based intermediate representation of the hardware design is stored in a source database.

20 Claims, 6 Drawing Sheets

(56) References Cited

U.S. PATENT DOCUMENTS

| | | | |
|---|---|---|---|
| 7,343,594 B1 | 3/2008 | Metzgen | |
| 7,363,610 B2 | 4/2008 | Alfieri | |
| 7,383,529 B2 | 6/2008 | Gupta et al. | |
| 7,395,358 B2 | 7/2008 | Mills et al. | |
| 7,433,813 B1 | 10/2008 | Ballagh et al. | |
| 7,472,055 B2 | 12/2008 | Garcia et al. | |
| 7,483,823 B2 | 1/2009 | Alfieri | |
| 7,577,707 B2 | 8/2009 | Hufferd et al. | |
| 7,581,201 B2 | 8/2009 | Kazda et al. | |
| 7,743,370 B1 * | 6/2010 | Krablin et al. | 717/156 |
| 7,802,147 B1 | 9/2010 | Johnson et al. | |
| 7,827,510 B1 | 11/2010 | Schubert et al. | |
| 8,117,574 B2 | 2/2012 | Deutschle et al. | |
| 8,141,059 B2 | 3/2012 | Ding et al. | |
| 8,180,943 B1 | 5/2012 | Priem | |
| 8,219,974 B2 | 7/2012 | Schmidt | |
| 8,458,630 B1 | 6/2013 | Van Canpenhout | |
| 8,463,589 B2 | 6/2013 | Clark et al. | |
| 8,464,217 B2 | 6/2013 | Janczewski | |
| 8,468,335 B2 | 6/2013 | Lin et al. | |
| 8,473,897 B2 | 6/2013 | Box et al. | |
| 8,558,839 B1 | 10/2013 | Wyatt | |
| 8,561,176 B1 | 10/2013 | Dalcher | |
| 8,648,856 B2 | 2/2014 | Newhall, Jr. et al. | |
| 8,776,030 B2 | 7/2014 | Grover et al. | |
| 8,930,861 B2 | 1/2015 | Alfieri | |
| 2001/0034876 A1 | 10/2001 | Panchul et al. | |
| 2002/0019969 A1 | 2/2002 | Hellestrand et al. | |
| 2002/0133369 A1 | 9/2002 | Johnson | |
| 2003/0121010 A1 | 6/2003 | Aubury | |
| 2004/0068640 A1 | 4/2004 | Jacobson et al. | |
| 2004/0225999 A1 | 11/2004 | Nuss | |
| 2004/0226006 A1 * | 11/2004 | Russell | 717/154 |
| 2005/0050509 A1 * | 3/2005 | Fields et al. | 716/18 |
| 2005/0144581 A1 | 6/2005 | Imai | |
| 2006/0041872 A1 | 2/2006 | Poznanovic et al. | |
| 2006/0236226 A1 | 10/2006 | Meijer et al. | |
| 2007/0055966 A1 | 3/2007 | Waddington et al. | |
| 2007/0219771 A1 | 9/2007 | Verheyen et al. | |
| 2007/0294647 A1 | 12/2007 | Fong et al. | |
| 2008/0270438 A1 | 10/2008 | Aronson et al. | |
| 2010/0088666 A1 * | 4/2010 | Box et al. | 717/104 |
| 2010/0268979 A1 | 10/2010 | Johnson | |
| 2012/0311411 A1 | 12/2012 | Kirkpatrick | |
| 2012/0324408 A1 | 12/2012 | Shacham et al. | |
| 2013/0014095 A1 | 1/2013 | Metzgen | |
| 2013/0019216 A1 | 1/2013 | Vasudevan et al. | |
| 2014/0278328 A1 | 9/2014 | Alfieri | |
| 2014/0280412 A1 | 9/2014 | Alfieri | |
| 2014/0282309 A1 | 9/2014 | Alfieri | |
| 2014/0282313 A1 | 9/2014 | Alfieri | |
| 2014/0282382 A1 | 9/2014 | Alfieri | |
| 2014/0282390 A1 | 9/2014 | Alfieri | |
| 2014/0310664 A1 | 10/2014 | Alfieri | |
| 2014/0310665 A1 | 10/2014 | Alfieri | |

OTHER PUBLICATIONS

U.S. Appl. No. 13/868,954, filed Apr. 23, 2013.
U.S. Appl. No. 13/844,374, filed Mar. 15, 2013.
U.S. Appl. No. 13/844,437, filed Mar. 15, 2013.
U.S. Appl. No. 13/844,400, filed Mar. 15, 2013.
U.S. Appl. No. 13/844,477, filed Mar. 15, 2013.
U.S. Appl. No. 13/860,472, filed Apr. 10, 2013.
U.S. Appl. No. 13/860,480, filed Apr. 10, 2013.
Non-Final Office Action from U.S. Appl. No. 13/868,954, dated May 13, 2014.
Non-Final Office Action from U.S. Appl. No. 13/844,437, dated Jan. 27, 2014.
Non-Final Office Action from U.S. Appl. No. 13/860,480, dated May 13, 2014.
Notice of Allowance from U.S. Appl. No. 13/860,472, dated May 21, 2014.
De Rauglaudre, D., "Camlp4-Tutorial," version 3.07, Sep. 30, 2003, http://caml.inria.fr/pub/docs/tutorial-camlp/index.html.
Notice of Allowance from U.S. Appl. No. 13/868,954, dated Aug. 22, 2014.
Non-Final Office Action from U.S. Appl. No. 13/844,374, dated Nov. 19, 2014.
Notice of Allowance from U.S. Appl. No. 13/844,437, dated Oct. 21, 2014.
Final Office Action from U.S. Appl. No. 13/844,437, dated Jul. 15, 2014.
Non-Final Office Action from U.S. Appl. No. 13/844,477, dated Sep. 11, 2014.
Notice of Allowance from U.S. Appl. No. 13/860,472, dated Sep. 4, 2014.
Final Office Action from U.S. Appl. No. 13/860,480, dated Aug. 21, 2014.
Non-Final Office Action from U.S. Appl. No. 13/860,480, dated Mar. 6, 2015.
Notice of Allowance from U.S. Appl. No. 13/844,437, dated Feb. 27, 2015.
Notice of Allowance from U.S. Appl. No. 13/860,472, dated Jan. 15, 2015.

* cited by examiner

SYSTEM, METHOD, AND COMPUTER PROGRAM PRODUCT FOR TRANSLATING A HARDWARE LANGUAGE INTO A SOURCE DATABASE

FIELD OF THE INVENTION

The present invention relates to integrated circuit design.

BACKGROUND

Hardware design and verification are important aspects of the hardware creation process. For example, a hardware description language may be used to model and verify circuit designs. However, current techniques for designing hardware have been associated with various limitations.

For example, validation and verification may comprise a large portion of a hardware design schedule utilizing current hardware description languages. Additionally, data flow control and other protocol logic may not be addressed by current hardware description languages during the hardware design process. There is thus a need for addressing these and/or other issues associated with the prior art.

SUMMARY

A system, method, and computer program product are provided for translating a hardware design. In use, a hardware design is received that is encoded as one or more data flows (e.g., a representations of a flow of data through a hardware design, etc.) and one or more control constructs (e.g., constructions that may perform various common data steering and storage operations, etc.). A node is generated for each data flow of the one or more data flows and for each control construct of the one or more control constructs. Additionally, connectivity of the nodes is determined to generate a graph-based intermediate representation of the hardware design and the graph-based intermediate representation of the hardware design is stored in a source database.

DETAILED DESCRIPTION

In various embodiments, data flows and constructs that represent a hardware design including one or more circuits are specified. The data flows and constructs are analyzed by a hardware design application program that includes one or more components. The hardware design application program may analyze the data flows and constructs, identify errors, and/or generate a representation of the hardware design that is suitable for simulation and/or synthesis.

A first component of the design application program is a first translation component that is configured to translate a hardware language encoding of the data flows and constructs into a source database. A second component of the design application program is a second translation component that is configured to translate the source database into a common hardware database. A third component of the design application program is a third translation component that is configured to translate the common hardware database into a conventional hardware design language that is suitable for simulation and/or synthesis.

Figure 1:
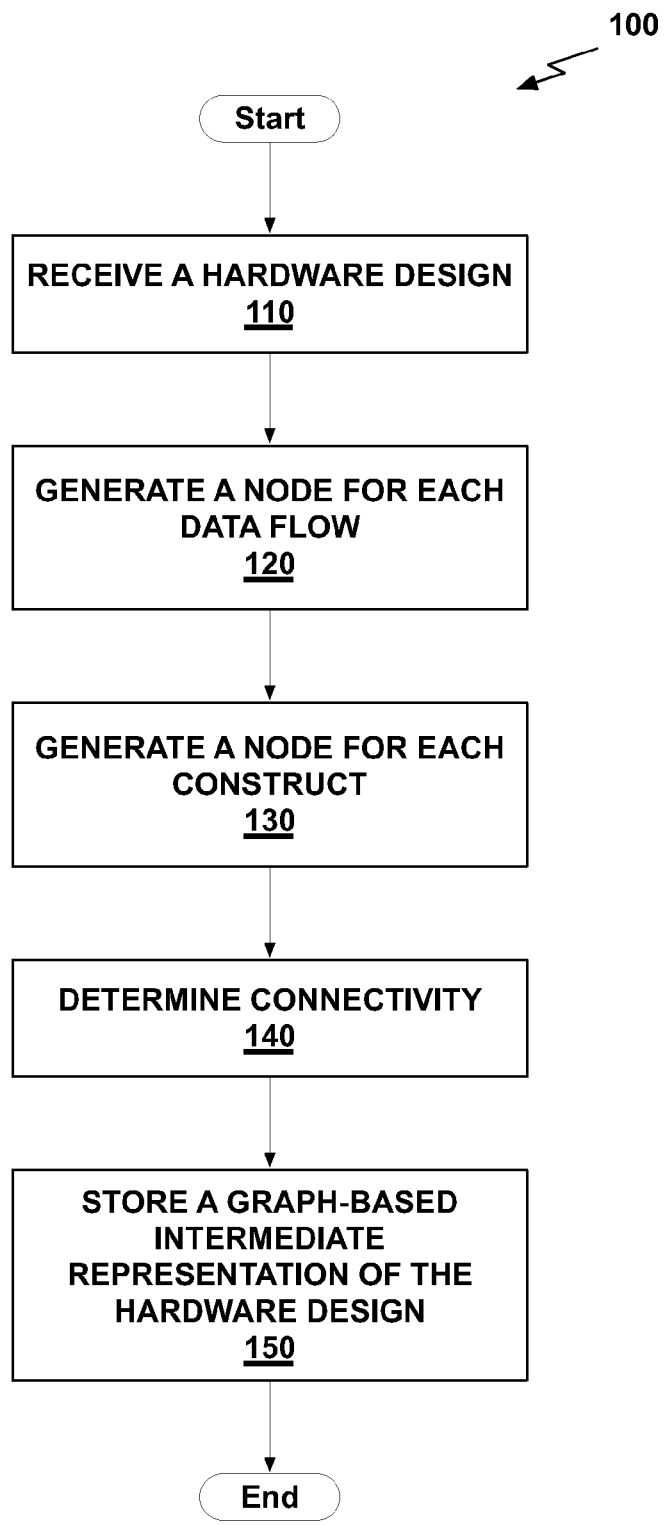
FIG. 1 shows a method for translating a hardware language into a source database, in accordance with one embodiment.

FIG. 1 shows a method 100 for translating a hardware language encoding of the data flows and constructs into a source database, in accordance with one embodiment. As shown in operation 110, a hardware design is received. The hardware design is encoded as one or more data flows (e.g., a representations of a flow of data through a hardware design, etc.) and one or more control constructs (e.g., constructions that may perform various common data steering and storage operations, etc.). As shown in operation 120, a node is generated for each data flow of the one or more data flows. As shown in operation 130, a node is generated for each control construct of the one or more control constructs. In one embodiment, the hardware design includes at least one compute construct and a node is also generated for the compute construct. As shown in operation 140, connectivity of the nodes generated by operations 120 and 130 is determined to generate a graph-based intermediate representation of the hardware design. As shown in operation 150, the graph-based intermediate representation of the hardware design is stored in a source database.

In one embodiment, the hardware design may include one or more of the following: a circuit design, a behavioral simulation model, an estimated timing model, etc. For example, the hardware design may include an integrated circuit design, a digital circuit design, an analog circuit design, a mixed-signal circuit design, etc. In another embodiment, the hardware design may be created utilizing the hardware description language. For example, the hardware design may be created by initiating a new hardware design and saving the new hardware design that is encoded as data flows and constructs into a database, utilizing the hardware description language. In yet another embodiment, both the data flow and the construct may be included within the hardware design.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Hardware Design Environment Overview

Figure 2:
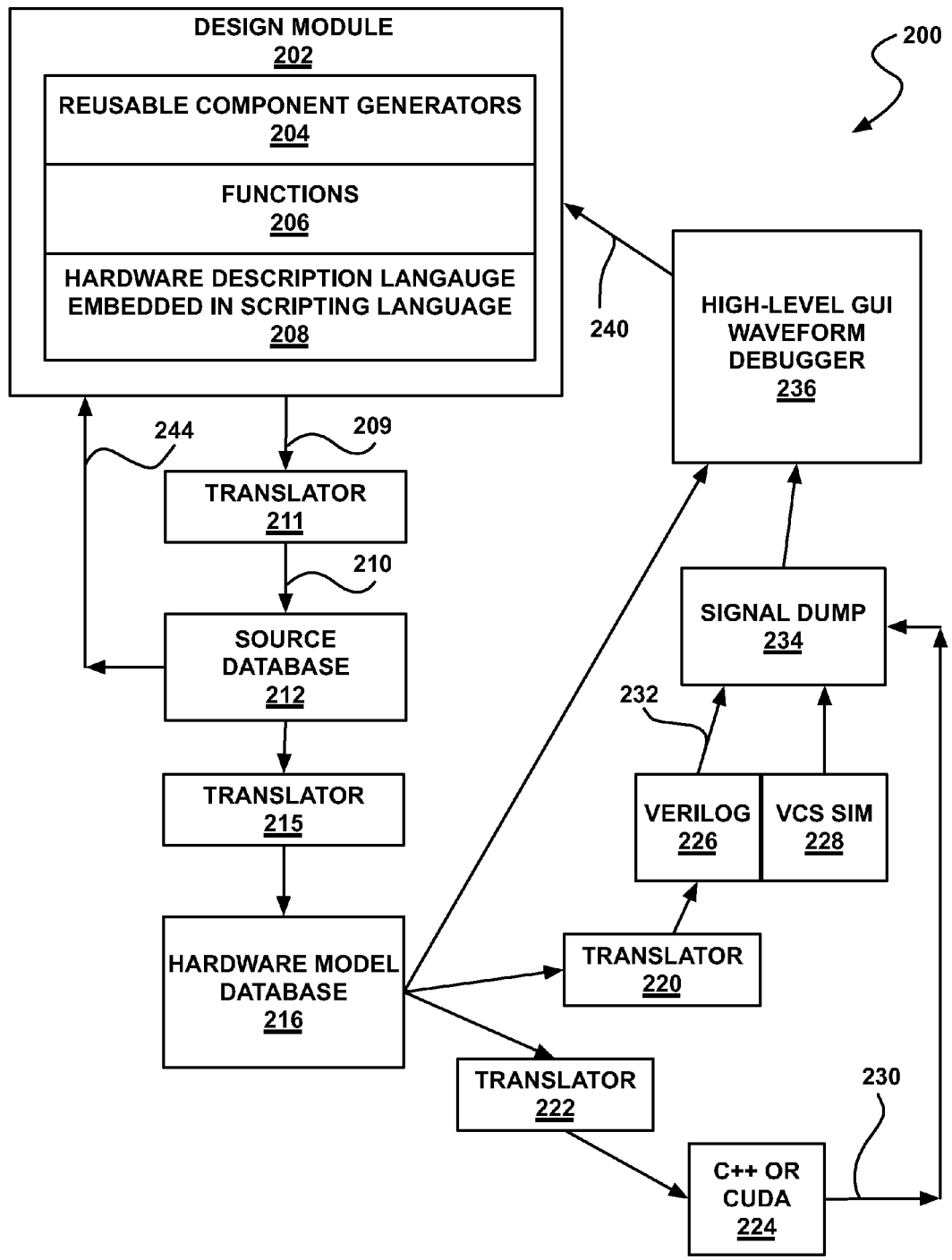
FIG. 2 shows an exemplary hardware design environment, in accordance with one embodiment.

FIG. 2 shows an exemplary hardware design environment 200, in accordance with one embodiment. As an option, the environment 200 may be carried out in the context of the functionality of FIG. 1. Of course, however, the environment 200 may be implemented in any desired environment. It should also be noted that the aforementioned definitions may apply during the present description.

As shown, within a design module 202, reusable component generators 204, functions 206, and a hardware description language embedded in a scripting language 208 are all used to construct a design 209 that is translated by a first translator 211 and stored as a source database 212. The first translator 211 generates a graph-based intermediate representation of the design 210 that is stored as the source database 212. Also, any build errors within the design 209 that are identified during the first translation are corrected 244, and the design module 202 is updated. Additionally, a second translation is performed on the source database 212 by a second translator 215. The second translator 215 generates a hardware model database 216 that may be stored in a memory. The hardware model database 216 is independent of any particular target hardware design language.

Additionally, the hardware model database 216 is translated by a third translator 222 into C++, CUDA™ 224, or other data-parallel language such as OpenCL, translated by a fourth translator 220 into Verilog® 226, or the hardware model database 216 is sent directly to the high-level GUI (graphical user interface) waveform debugger 236. If the hardware model database 216 is translated into C++ or CUDA™ 224, the design represented in C++ or CUDA™ 230 is provided to a signal dump 234 and then to a high level debugger 236. If the hardware model database 216 is translated into Verilog® 226, the design represented in Verilog® 232 is provided to the signal dump 234 or a VCS simulation 228 is run on the design represented in Verilog® 232, which is then provided to the signal dump 234 and then to the high level GUI waveform debugger 236. Any logic bugs found using the high level GUI waveform debugger 236 can then be corrected 240 utilizing the design module 202.

Data Flows

A data flow may be constructed using the hardware description language embedded in a scripting language 208. The data flow may be based on one or more parameters, at least one of which may correspond to an interface protocol. In one embodiment, the interface protocol may include a communications protocol associated with a particular interface. In another embodiment, the communications protocol may include one or more formats for communicating data utilizing the interface, one or more rules for communicating data utilizing the interface, a syntax used when communicating data utilizing the interface, semantics used when communicating data utilizing the interface, synchronization methods used when communicating data utilizing the interface, etc.

Additionally, in one embodiment, one or more parameters may include an identification of an interface (e.g., an interface of a hardware design, etc.). In another embodiment, one or more parameters may include a width field associated with the interface. In yet another embodiment, one or more parameters may be received utilizing a hardware description language. For example, one or more parameters may be received utilizing the hardware description language embedded in a scripting language 208.

In one embodiment, the data flow (input or output) may represent a flow of data. For example, the data flow may represent a flow of data through a hardware design. In another embodiment, the data flow may include one or more groups of signals. For example, the data flow may include one or more groups of signals including implicit flow control signals that may operate according to the interface protocol. In yet another embodiment, the data flow may be associated with one or more interfaces. For example, the data flow may be associated with one or more interfaces of a hardware design corresponding to at least one of the received parameters. In another embodiment, the data flow may be constructed as a data type.

Also, in one embodiment, constructing the data flow as a data type may include implementing the data flow as an instance of a formal object class within a hardware description language. In another embodiment, the constructed data flow may include one or more fields with assigned values (e.g., one or more width fields each associated with an interface, etc.). In yet another embodiment, the constructed data flow may be viewed as a predetermined data structure (e.g., a hash, etc.) within the scripting language.

Further, in one embodiment, the data flow may have multiple levels of hierarchy. For example, the data flow may include a superflow that represents multiple flows of data and that is associated with a plurality of interfaces. In another embodiment, the superflow may act as an array within the scripting language. In yet another embodiment, the superflow may include one or more subfields with assigned values. In still another embodiment, the data flow may be included within the superflow (e.g., as a data flow within the hierarchy of the superflow, etc.).

Further still, in one embodiment, the data flow may have a numeric hierarchy. For example, all fields of a data flow may be numbered with successive whole integers, starting at zero. In another embodiment, the data flow may have an alphabetic hierarchy. For example, all fields of a data flow may be labeled with one or more identifiers (e.g., letters of the alphabet, underscores, decimal digits, etc.). In yet another embodiment, the data flow may have a custom naming hierarchy. For example, all fields of a data flow may be labeled with custom (e.g., user-provided, etc.) names.

Also, in one embodiment, the data flow may include a cloned data flow. For example, the data flow may be created by cloning another data flow, utilizing the hardware description language. In another embodiment, the data flow itself may be cloned to create another data flow. In yet another embodiment, the data flow may be an output data flow of a construct. In still another embodiment, the data flow may be located in a database.

An integrated circuit design is created, utilizing the hardware description language embedded in a scripting language 208. In one embodiment, the integrated circuit design may be saved to a memory or hard drive after the integrated circuit design is created. In another embodiment, the integrated circuit design may be created in the hardware description language. In yet another embodiment, the integrated circuit may be created utilizing a design create construct. Table 1 illustrates an exemplary design create construct that may be used within the scripting language to create an integrated circuit design, in accordance with one embodiment. Of course, it should be noted that the exemplary design create construct shown in Table 1 is set forth for illustrative purposes only, and thus should not be construed as limiting in any manner.

TABLE 1 aFlow->Design_Create( name => "NV_XX_yyy" );
...
aFlow->Design_Save( top => $topio );

Additionally, in one embodiment, one or more options may be associated with the creation of the integrated circuit design. Table 2 illustrates exemplary circuit design options, in accordance with one embodiment. Of course, it should be noted that the exemplary circuit design options shown in Table 2 are set forth for illustrative purposes only, and thus should not be construed as limiting in any manner.

TABLE 2

| Option | Type | Default | Description |
|---|---|---|---|
| name | id | required | name of top-level module for design |
| clks | array_of_clkspec | [ {clk => "clk", reset_ => "reset_"} ] | array of info about primary clk-reset pairs; clkspec is a hash with "clk" and "reset_" as required fields and currently there are no optional clkspec fields, but there will likely be others in the future; the first clk name in the array becomes the default for created constructs |
| src_dirs | array_of_string | [ "." ] | array of directories Design_Inst( ) searches for source databases of instantiated designs; by default, we search only in the current directory; note that this has nothing to do with the directories Perl searches for .pm modules |

Further, one or more data flows are created in association with the integrated circuit design. In one embodiment, each of the one or more data flows may represent a flow of data through the integrated circuit design and may be implemented as instances of a data type utilizing a scripting language (e.g., Perl, etc.). For example, each data flow may be implemented in Perl as a formal object class. In another embodiment, one or more data flows may be associated with a single interface. In yet another embodiment, one or more data flows may be associated with multiple interfaces, and each of these data flows may be called superflows. For example, superflows may allow the passing of multiple interfaces utilizing one variable.

Further still, in one embodiment, each of the one or more data flows may have an arbitrary hierarchy. In another embodiment, each node in the hierarchy may have alphanumeric names or numeric names. In yet another embodiment, the creation of the one or more data flows may be tied into array and hash structures of the scripting language.

The scripting language provides built-in primitives and syntaxes for dynamic arrays (lists) and hashes. Arrays implement an ordered (numbered) list of values, but have no identifiers other than indexes. Hashes implement sets of named values, but have no order among the names. Hardware designs are typically constructed using both naming (of signals and units) and ordering of names.

To solve this problem, hierarchical data flows are implemented using name=>subflow pairs. In some scripting languages such as Perl, the '=>' operator is really just a comma (or can be preparsed into such), so an array initializer such as [a=>20, b=>30, c=>40] is equivalent to ["a", 20, "b", 30, "c", 40], where the values 20, 30, and 40 are bitwidths of the named data subflows a, b, and c, respectively. In other words, it is an array of (name, value) pairs. This syntax provides both non-numeric names as well as ordering of fields.

The aFlow class contains various types of constructors and shorthand notations for creating new, inactive data flows. For example, aFlow->Uint(20) returns a data flow that has no name but is 20 bits wide. Such a data flow is called a leaf data flow and a leaf flow may be 0 bits wide and will consume no area (having a value that is always 0). aFlow->Const(20) returns an aFlow that is wide enough to hold the value 20 (i.e., 5 bits) and records the constant value 20. Note that the value 0 consumes 0 bits. As a shorthand, the preparser, may be configured to allow a full set of Verilog® literals such as 32'hbabecafe. Verilog® literals may be automatically converted into constant data flows by a preparser before the scripting language sees them. For example, the preparser may convert the Verilog® literal 32'hbabecafe to aFlow->Const ("32'hbabecafe"). In general, the preparser converts syntax specific to the hardware description language into aFlow method calls. For example, because 'hdeadbeef syntax would confuse the preparser (single quote begins a character string in some languages), the user may use 0'hdeadbeef to indicate that the width of the literal (i.e., 32 bits) should be calculated.

aFlow->Hier( ) takes a list of name=>value pairs for the initial set of fields for the hierarchy flow. If the value is an integer (e.g., 20, 40, 60) then that value denotes a leaf flow of that bitwidth with the name pointing to that leaf. If the value is a Verilog® literal, then that field is a constant leaf. In one embodiment, the hardware description language does not allocate data flows and FIFO entries for parts of data flows that are constants.

aFlow->Hier( ) allows nested data structures, such as aFlow->Hier(a=>20, b=>[c=>40, d=>80], e=>8'h1f), which means that a is a leaf data flow, but b is a hierarchy data flow with leaf flows c and d. e is a constant data flow of given width and value. These shorthands translate into various aFlow constructor calls in the source database 212. In another embodiment, a hierarchical level may have all alphanumeric names or all numeric names. For example, if the names are numeric, they may be numbered with whole integers starting with zero.

In order to facilitate the creation of numerical hierarchy data flows where each subflow contains the same structure, one can use aFlow->Hier_N(10, name=>subflow, etc.) syntax which takes the number of subflows followed by the same type of arguments one would pass to aFlow->Hier( ). $Flow->Clone( ) can be used to clone an existing data flow $Flow. even if the data flow is an active data flow (data flow activation is described further herein). The resulting data flow is always inactive. $Flow->Clone( ) clones the existing flow but converts all constant leaves into normal Uint( ) leaves of the same width.

Once a data flow is constructed using a data flow creation construct (e.g., Hier( ), Hier_N( ), Clone( ), etc.), the data flow appears thereafter as a hash. In one embodiment, the data flow appears as an anonymous hash in the Perl scripting language. Built-in hash operations may then be used to access and change the data flow or one of the subflows of the data flow. aFlow enables the accessing and editing of data flows by overriding the hash operators in the scripting language—in Perl, this is called a "tied hash".

Further, in one embodiment, a level in the hierarchy may be called the iflow level. For example, iflow may refer to an interface data flow. In another example, the iflow level may denote one interface, specifically the data for one cycle on the interface. In another embodiment, by default, a root of the data flow hierarchy may be the iflow level. In this way, each data flow may represent one interface by default. In yet another embodiment, flow control may be handled implicitly for each iflow.

Further still, in one embodiment, one or more of the data flows may include a superflow. For example, a superflow may include a data flow whose iflow level is lower than the top level. In this way, a superflow may have multiple iflows (each representing an interface with independent flow control) within it. In another embodiment, each of the one or more data flows may have an inactive or active status. For example, while a data flow is being constructed, it may be inactive. In another example, inactive data flows may be modified in any arbitrary way.

Also, in one embodiment, before a data flow can be passed to a construct, it may need to be made active (e.g., using a command such as Defer_Output( ), etc.). At that point, the data flow may not be modified directly by a user, but only indirectly by control and compute constructs. In another embodiment, Defer_Output( ) may have an option that lets a user select a level in the data flow as the iflow level. In yet another embodiment, by default, level 0 (top) may be the iflow level.

Table 3 illustrates exemplary data flow creation constructs within a scripting language, in accordance with one embodiment. Of course, it should be noted that the exemplary data flow creation constructs shown in Table 3 are set forth for illustrative purposes only, and thus should not be construed as limiting in any manner.

Table 3

1. Hier( ) may create a named hierarchy of arbitrary structure
2. Hier_N( ) may create numeric hierarchies
3. Hier_Named_N( ) may create a named hierarchy with N fields with the same name prefix
4. Hash manipulations are used to add and remove subflows from hierarchies
5. Uint( ) may create a simple leaf flow with no name
6. Const($val) may create a leaf that has a constant value
7. Const_All_Ones($width) may create a leaf that has a constant value that is width $width and all 1's
8. Literals like 32'hdeadbeef may implicitly create constant values
9. Clone( ) may copy an active or inactive flow, and may always yield an inactive flow; all constant leaves may also be cloned
10. Clone(0) is like Clone( ) but may not clone constant leaves In one embodiment, once a data flow is marked as active, it may not be changed directly, instead the data flow may be changed by providing it as an input a construct. Additionally, in one embodiment, if a data flow is a primary input to the design, it may be passed to Design_Save( ) as part of the top I/O hash. In another embodiment, if the data flow is part of some kind of circular pipeline where the data flow goes into the top of the pipeline, then comes out the bottom later, a Connect operator may be used to connect the real output that comes out the bottom of the pipeline with the deferred output that is input to the top of the pipeline.

Figure 3A:
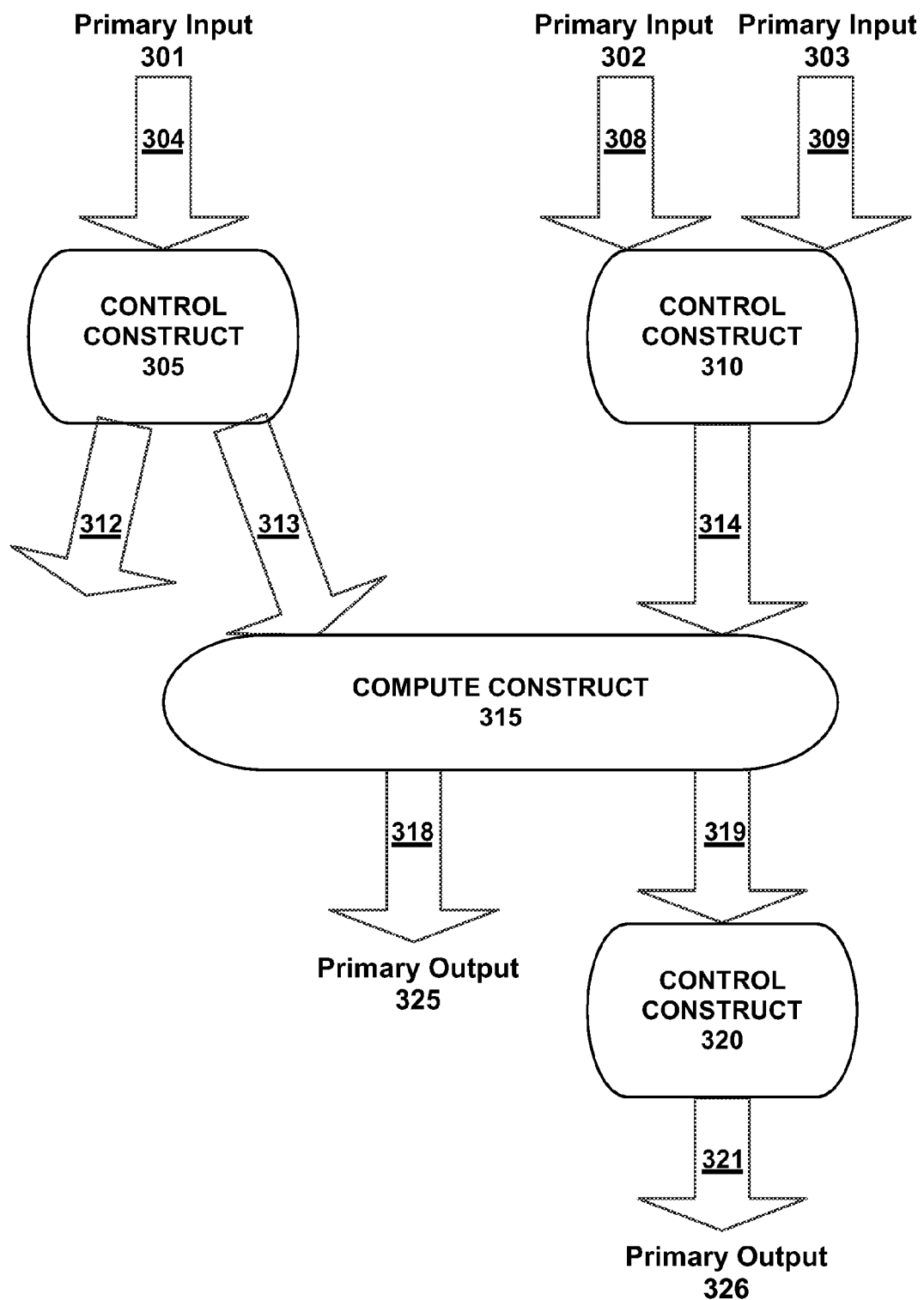
FIG. 3A shows a conceptual diagram of a hardware design encoded as data flows, control constructs, and a compute construct, in accordance with one embodiment.

FIG. 3A shows a conceptual diagram of a hardware design encoded as data flows, control constructs, and a compute construct, in accordance with one embodiment. The hardware design includes three primary inputs 301, 302, and 303 corresponding to data flows 304, 308, and 309, respectively. The data flow 304 is an input data flow to the control construct 305. The control construct 305 operates on the input data flow 304 to produce the output data flows 312 and 313. In one embodiment the control construct 305 is configured to split the input data flow 304 into the output data flows 312 and 313. In another embodiment, the control construct 305 is configured to broadcast the input data flow 304 to the output data flows 312 and 313.

The data flows 308 and 309 are input data flows to the control construct 310. The control construct 310 operates on the input data flows 308 and 309 to produce the output data flow 314. In one embodiment the control construct 310 is configured to merge the input data flows 308 and 309 to produce the output data flow 314. The compute construct 315 operates on the input data flows 313 and 314 to produce the output data flows 318 and 319. The control constructs and compute constructs are described further herein. The output data flow 318 is configured as a primary output 325 of the hardware design. The output data flow 319 is an input flow to the control construct 320. The control construct 320 operates on the input data flow 319 to produce an output data flow 321 that is configured as a primary output 326 of the hardware design.

Control Constructs

In addition to data flows, a hardware design may also include constructs. In one embodiment, there may be two categories of constructs, control constructs and compute constructs. Control constructs, such as control constructs 305, 310, and 320 may perform various common data steering and storage operations, be implemented in the hardware design application program, and be inserted into a hardware design representation. Compute constructs, such as the compute construct 315 may provide a mechanism by which a designer can represent circuitry to perform user-defined operations. For example, in one embodiment, the function of a particular state machine may be encoded within a compute construct.

In one embodiment, the one or more control constructs may include an entity (e.g., a module, etc.) implemented as part of the hardware description language that receives one or more data flows as input. In another embodiment, the one or more control constructs may be located in a database. In yet another embodiment, the one or more control constructs may perform one or more operations based on the input data flow or flows. In still another embodiment, the one or more control constructs may be built into the hardware description language. In another example, the one or more control constructs may perform one or more data steering and storage operations, utilizing the constructed data flow as input.

Furthermore, in one embodiment, the one or more control constructs may each create one or more output data flows, based on one or more input data flows. In another embodiment, the one or more output data flows may be input into one or more additional constructs (e.g., control constructs, compute constructs, etc.). In yet another embodiment, the one or more control constructs may each include one or more parameters. For example, the one or more control constructs may each include a name parameter that may indicate a name for that construct. In another example, each of the one or more control constructs may include a comment parameter that may provide a textual comment that may appear in a debugger when debugging a design. In yet another example, each of the one or more control constructs may include a stallable parameter that may indicate whether automatic flow control is to be performed within that construct.

Further still, in one example, each of the one or more control constructs may include a parameter used to specify a depth of an output queue (e.g., a first in, first out (FIFO)

queue, etc.) for each output data flow of that construct. In another example, each of the one or more control constructs may include a parameter that causes an output data flow of that construct to be registered out. In yet another example, each of the one or more control constructs may include a parameter that causes a ready signal of an output data flow of that construct to be registered in and an associated row of skid flip-flops to be added.

Also, in one embodiment, one or more of the control constructs may include a separate construct that creates multiple output data flows from a single input data flow. In another embodiment, one or more of the control constructs may include a merge construct that creates a single output data flow from multiple input data flows. In yet another embodiment, one or more of the control constructs may include a multicast construct that takes a single input data flow and sends it to one or more output data flows. In still another embodiment, one or more of the control constructs may include a select construct that accepts multiple input data flows and selects one of them to be an output data flow.

Additionally, in one embodiment, one or more of the control constructs may include a connect construct that connects an input data flow of the construct to a deferred output. A deferred output may include a primary input to the design or an input data flow that does not yet connect to an output data flow of another construct. In another embodiment, one or more of the control constructs may include an as construct that maps flow data to a different format. In yet another embodiment, one or more of the control constructs may include a shuffle construct that rearranges a structuring of input data flows. In still another embodiment, one or more of the control constructs may include a derive clock construct that creates a new clock from an existing clock.

Additionally, as shown in FIG. 3A, one or more control constructs are incorporated into the integrated circuit design in association with the one or more data flows. In one embodiment, the first translator 211 and/or second translator 215 are configured to check the connectivity of the one or more data flows and the one or more constructs. In another embodiment, bugs may be immediately found and the design script may be killed immediately upon finding an error. In this way, a user may avoid reviewing a large amount of propagated errors. In yet another embodiment, first translator 211 and/or second translator 215 may be configured to check that each input data flow of a construct is an output data flow from some other construct or is what is called a deferred output.

For example, a deferred output may include an indication that a data flow is a primary design input or a data flow will be connected later to the output of some future construct. In another embodiment, it may be confirmed that each input data flow is an input to no other constructs. In yet another embodiment, each construct may create one or more output data flows that may then become the inputs to other constructs. In this way, the concept of correctness-by-construction is promoted. In still another embodiment, the constructs are also superflow-aware. For example, some constructs may expect superflows, and others may perform an implicit 'for' loop on the superflow's subflows so that the user doesn't have to manipulate the subflows manually. For example, the data flow may include a superflow, and one or more of the control constructs may perform automatic looping on a plurality of subflows of the superflow, such that each subflow of the superflow is automatically analyzed within the one or more control constructs.

Furthermore, in one embodiment, a set of introspection methods may be provided that may allow user designs and generators to interrogate data flows. For example, the one or more control constructs may use these introspection functions to perform their work. More specifically, the introspection methods may enable obtaining a list of field names within a hierarchical data flow, widths of various subflows, etc. In another embodiment, in response to the introspection methods, values may be returned in forms that are easy to manipulate by the scripting language.

Also, in one embodiment, the one or more control constructs may each contain a plurality of common parameters. For example, the one or more control constructs may contain a "name" parameter that indicates a base module name that will be used for the construct and which shows up in the debugger. In another embodiment, the one or more control constructs may contain a "comment" parameter that provides a textual comment that shows up in the debugger. In yet another embodiment, the one or more control constructs may contain a "stallable" parameter that indicates whether automatic flow control is to be performed according to an interface protocol within the construct (e.g., whether input data flows are to be automatically stalled when outputs aren't ready, etc.). For example, if the "stallable" parameter is 0, the user may use various flow methods such as Valid( ) and Ready( ), as well as a Stall statement to perform manual flow control. In another example, additional flow controls such as vld/rdy_next and vld/credit may be used.

Additionally, in one embodiment, the one or more control constructs may contain an out_fifo parameter that allows the user to specify a depth of the output FIFO for each output data flow. For example, when multiple output data flows are present, the user may supply one depth that is used by all, or an array of per-output-flow depths. In another embodiment, the one or more control constructs may contain an out_reg parameter that causes the output data flow to be registered out. For example, the out_reg parameter may take a 0 or 1 value or an array of such like out_fifo. In yet another embodiment, the one or more control constructs may contain an in_reg parameter that causes the input data flow to be registered in. In still another embodiment, the one or more control constructs may contain an in_fifo parameter that allows the user to specify a depth of the input FIFO for each input data flow. Further, in one embodiment, the one or more control constructs may contain an out_rdy_reg parameter that causes the output data flow's implicit ready signal to be registered in. In another embodiment, out_fifo, out_reg, and out_rdy_reg may be mutually exclusive and may be used in any combination.

The "stallable", out_reg, out_fifo, and out_rdy_reg parameters specify how the interface protocol is implemented. An interface protocol defines a characteristic of an input or output data flow that is represented in a simulation model and a synthesized circuit created from the hardware design representation. For example, circuitry is automatically inserted into a representation of the hardware design based on the interface protocol. The automatic insertion reduces the amount of work needed to enter a design by a user and presumably also ensures that the interface protocol operation has been thoroughly verified. Furthermore, the hardware design application components, such as the first translator 211 and the second translator 215 may perform various checks to identify errors when data flows having incompatible interface protocols are connected. Errors may also be identified during simulation by the automatically inserted representations.

Further still, in one embodiment, clocking and clock gating may be handled implicitly. For example, there may be three levels of clock gating that may be generated automatically: fine-grain clock gating (FGCG), second-level module clock gating (SLCG), and block-level design clock gating (BLCG).

In another embodiment, FGCG may be handled by synthesis tools. In yet another embodiment, a per-construct (i.e., per-module) status may be maintained. In still another embodiment, when the status is IDLE or STALLED, all the flops and rams in that module may be gated. In another embodiment, the statuses from all the constructs may be combined to form the design-level status that is used for the BLCG. This may be performed automatically, though the user may override the status value for any Compute( ) construct using the Status <value> statement.

Also, in one embodiment, the one or more control constructs may include a Separate( ) construct. For example, the Separate( ) construct may take an input data flow and provide ways of peeling off various fields from that data flow (e.g., by splitting a data flow into multiple output data flows and returning the output data flows, etc.). In another example, a user can create as many data flows as needed from a single input data flow. In another embodiment, regular expressions may be used to concisely describe the set of fields to be retained for each output data flow. If the input data flow is a superflow (multiple interface data flows), the Separate( ) construct may implicitly perform the same operation on the interface data flows in parallel. The output of the Separate( ) construct may be a list of data flows or a superflow containing them. In yet another embodiment, there may be options that allow levels of hierarchy to be automatically collapsed in the process. If the chosen fields have numeric names, they may be renumbered automatically (e.g., so they follow 0, 1, 2, etc.).

Further, in one embodiment, the Separate( ) construct may split the input data flow in one or more ways. For example, the Separate( ) construct may supply a list of fields to be kept for each output data flow. The list may contain regular expressions. In another example, the Separate( ) construct may supply a count of the number of fields to be kept for each output data flow. In yet another example, the Separate( ) construct may duplicate the input data flow N times, producing N+1 output data flows. As shown in FIG. 3A, the control construct 305 may be a separate( ) construct that receives an input data flow 304 and splits the input data flow 304 into an output data flow 312 and an output data flow 313.

Table 4 illustrates the options associated with a Separate( ) construct, in accordance with one embodiment. Of course, it should be noted that the options shown in Table 4 are set forth for illustrative purposes only, and thus should not be construed as limiting in any manner.

TABLE 4

| Option | Type | Default | Description |
|---|---|---|---|
| name | id | required | name of generated module |
| comment | string | undef | optional comment to display in the debugger (highly recommended) |
| keep | array_of_namelist | one of these 3 is required | array of strings each of which is a list of names to keep for that output flow |
| keep_count | array_of_int | one of these 3 is required | array of counts each of which is the number of subflows to keep for that output flow |
| duplicate | int | one of these 3 is required | number of times to simply duplicate the input flow (this count+1 are returned) |
| level | string | iflow | level at which to perform separate |
| remove_hier | array_of_int | [0, 0, ...] | array of boolean flags each of which indicates whether a level of hierarchy is to be removed for that output flow |
| clk | id | global default | clock to use for this construct |
| stallable | int | global default | whether the construct is stallable |
| out_reg | array_of_int | [global default, ...] | array of 0 or 1 indicating whether the corresponding output iflow is registered out |
| out_separate | int | [1] | indicates that the output is a separate list of flows (default value of 1) or a superflow (0) |
| out_rdy_reg | array_of_int | [global default, ...] | array of 0 or 1 indicating whether the corresponding output iflow's rdy signal is registered in; causes a skid flop to be added even if out_reg=0. |
| out_fifo | array_of_fifospec | [0, 0, ...] | array of fifo specs, which are currently limited to a simple int representing depth of the fifo for the corresponding output iflow; out_reg and out_rdy_reg flops are after the fifo |

Further still, in one embodiment, if the stallable option is 1, then the input may be stalled until data can be advanced on all outputs. In another embodiment, the input may not be transferred to any output until all outputs can accept it. In yet another embodiment, if the stallable option is 0, a simulation-time check may be generated by the second translator 215 or the third translator 220 such that the input may always be transferred to all outputs whenever valid input is available.

The keep option allows for explicit naming of the subflows that are kept for each output data flow. In one embodiment, each name list may be enclosed in double quotes. In another embodiment, each name may be an identifier or a regular expression. In still another embodiment, unused input subflows may be dropped. The duplicate option may provide a quick way to completely duplicate the input data flow. In another embodiment, the count may be one less than the number of copies returned.

The keep_count option may split a numerical hierarchical into multiples where each output data flow contains some count of the next input subflows. In one embodiment, the chosen subflows may be renumbered in the second, third, etc. output data flows. In another embodiment, not all input subflows may need to be consumed.

The remove_hier option may allow for the removal of a level of a hierarchy for each output data flow. Additionally, the out_reg option may indicate that a particular output is to be registered (i.e., output via flip-flops).

Additionally, in one embodiment, the one or more control constructs may include a Merge( ) construct. For example, the Merge( ) construct may be the inverse of the Separate( ) construct. In another embodiment, the Merge( ) construct may take multiple input data flows (e.g., in list form, superflow form, etc.) and may merge the corresponding fields into the same data flow. In yet another embodiment, when fields are names, they may not conflict in name. In still another embodiment, when fields are numbered, they may conflict so they may be renumbered. In another embodiment, all other features of the Separate( ) construct may be supported. As shown in FIG. 3A, the control construct 310 may be a merge( ) construct that receives input data flows 308 and 309 and merges the input data flows into an output data flow 314.

Table 5 illustrates the options associated with a Merge( ) construct, in accordance with one embodiment. Of course, it should be noted that the options shown in Table 5 are set forth for illustrative purposes only, and thus should not be construed as limiting in any manner.

TABLE 5

| Option | Type | Default | Description |
|---|---|---|---|
| name | id | required | name of generated module |
| comment | string | undef | optional comment to display in the debugger (highly recommended) |
| Others | array_of_flow | required | array of other flows to be merged |
| level | string | iflow | level at which to perform the merge |
| add_hier | 0 or 1 | 0 | indicates whether to add a level of hierarchy to each input (at level) before doing the merge |
| clk | id | global default | clock to use for this construct |

TABLE 5-continued

| Option | Type | Default | Description |
|---|---|---|---|
| stallable | 0 to 1 | global default | whether the construct is stallable |
| out_reg | 0 or 1 | global default | 0 or 1 indicating whether the output iflow is registered out |
| out_rdy_reg | 0 or 1 | global default | 0 or 1 indicating whether the output iflow's rdy signal is registered in; causes a skid flop to be added even if out_reg=0. |
| out_fifo | fifospec | 0 | a fifospec which is currently limited to a simple int representing depth to the fifo for the output iflow; out_reg and out_rdy_reg flops are after the fifo |

In one embodiment, the Merge( ) construct may take multiple input data flows and merge them into one output data flow. In another embodiment, if the stallable option is 1, then inputs may be stalled until all arrive and an output cycle can be advanced. In another embodiment, if the stallable option is 0, then all input data flows may be valid in the same cycle because there may be no way to stall any inputs. This may be checked at simulation time.

Further, in one embodiment, the one or more control constructs may include a Multicast( ) construct. For example, the Multicast( ) construct may take a single data flow input and send it to one or more output data flows. In another embodiment, there may be various ways to specify the mask of outputs to receive the input, including embedding the mask in the input data flow or providing a separate Unicast/Destmask input data flow. In yet another embodiment, the Multicast( ) construct may implicitly work in parallel on input data flows that are superflows, and produce corresponding superflows. In still another embodiment, automatic data flow control may be provided if stallable is 1.

Table 6 illustrates the options associated with a Multicast( ) construct, in accordance with one embodiment. Of course, it should be noted that the options shown in Table 6 are set forth for illustrative purposes only, and thus should not be construed as limiting in any manner.

TABLE 6

| Option | Type | Default | Description |
|---|---|---|---|
| name | id | required | name of generated module |
| comment | string | undef | optional comment to display in the debugger (highly recommended) |
| count | int | required | number of output iflows per input iflow |
| broadcast | int | 1 of these 6 is required | broadcast to all <count> output iflows |
| Unicast_Dest_Flow | flow | 1 of these 6 is required | send to one ouput; the unicast flow must have one field of width log2(count) |
| unicast_dest_field | id | 1 of these 6 is required | send to one output; the destination is a separate field in the input with this name |
| Destmask_Flow | flow | 1 of these 6 is required | send to zero or more outputs; the destination mask must have one field of width <count> |
| destmask_field | id | 1 of these 6 is required | send to zero or more outputs; the destination mask is a seperate field in the input with this name |
| destmask_code | code | 1 of these 6 is required | send to zero or more outputs; the destination mask is computed combinatorially by a user-supplied code block; the code block receives the input iflow and the output destmask flow as parameters from Multicast( ) |

TABLE 6-continued

| Option | Type | Default | Description |
|---|---|---|---|
| unicast_dest_field_drop | 0 or 1 | 0 | when unicast_dest_field is given, indicates whether to drop the field in the output iflows |
| destmask_field_drop | 0 or 1 | 0 | when destmask_field is given, indicates whether to drop the field in the output iflows |
| clk | id | global default | clock to use for this construct |
| stallable | 0 or 1 | global default | whether the construct is stallable |
| out_reg | array_of_int | [global default, ...] | array of 0 or 1 indicating whether the corresponding output iflow is registered out |
| out_rdy_reg | array_of_int | [global default, ...] | array of 0 or 1 indicating whether the corresponding output iflow's rdy signal is registered in; causes a skid flop to be added even if out_reg=0. |
| out_fifo | array_of_fifospec | [0, 0, ...] | array of fifo specs, which are currently limited to a simple int representing depth of the fifo for the corresponding output iflow; out_reg and out_rdy_reg flops are after the fifo |
| out_separate | int | 0 | indicates whether to return to a list of flows or return one superflow (default) |

In one embodiment, the Multicast( ) construct may take one input iflow and sends it to one or more output iflows. Table 7 illustrates various options for redirecting an input data flow using the Multicast ( ) construct, in accordance with one embodiment. Of course, it should be noted that the options shown in Table 7 are set forth for illustrative purposes only, and thus should not be construed as limiting in any manner.

Table 7

1. Use the broadcast=>1 option to send it always to all outputs
2. Use the Unicast_Dest_Flow option to have a side flow indicate the single output that should receive the input
3. Use the Destmask_Flow option to have a side flow that contains a bitmask indicating some arbitrary number of zero or more outputs to receive the input
4. Use the unicast_dest_field option to indicate that the unicast destination is embedded in the input as a separate field
5. Use the destmask_field option to indicate that the destmask is embedded in the input as a separate field
6. Use the destmask_code option that allows you to write arbitrary code to compute the destination using any combination of input fields Additionally, in one embodiment, the multicast may always occur at the iflow level. In another embodiment, if stallable is 1, then the input iflow may be stalled until all destined output iflows are unstalled. No outputs may receive the input until all of them are unstalled. In yet another embodiment, if stallable is 0, then the input iflow and the Unicast_Dest_Flow/Destmask_Flow iflow may be valid in the same clock cycle because there may be no way to stall any inputs. This may be checked at simulation time. In still another embodiment, the Multicast( ) construct may not return a list of data flows. Instead, it may returns a superflow containing all the output iflows. The out_separate=>1 option may be used to have the Multicast( ) construct return a list.

The destmask may be embedded in the input data flow as the "destmask" field. The destmask_field_drop option may be used to drop the destmask from the output iflows. The destmask_code option may allow for the supplying of a code block to perform a computation of a destmask from various fields in the input, where such computations are performed combinationally. For example, destmask may be set to all 0's if "a" is 0; otherwise it may be set to the lower 3 bits of "b." In another embodiment, the code block may work similarly to Compute( ) code blocks. For example, the input iflow may be passed by Multicast( ) as the first argument. The second argument is the data flow holding "destmask" which may be assigned by the code block. If the input data flow has multiple iflows, the code block may get called for each input iflow, thus producing a separate destmask for each input iflow. In one embodiment, a Shuffle( ) construct may be used to rearrange the output iflows.

Further still, in one embodiment, the one or more control constructs may include a Select( ) construct. For example, the Select( ) construct may be the inverse of Multicast( ) and may perform arbitration. In another embodiment, the Select( ) construct may take a list of data flows or a superflow where all interface data flows have the same structure, and may choose one interface data flow for its output. For example, one arbitration algorithm may be round-robin (RR), but any type arbiter may be supported, including priority-based, least recently used (LRU), weighted-RR, etc. In another embodiment, the arbiters may be implemented separately and may be registered, then referred to by name in the Select( ) construct. Further, in yet another embodiment, a user may specify arbitration code, or may supply the arbitration decision as a separate input data flow. Like Multicast( ), the input data flows may be superflows, and the Select( ) construct may be applied in parallel and may produce an output superflow containing the answers. Further, data flow control may be automatically managed by default.

Table 8 illustrates the options associated with a Select( ) construct, in accordance with one embodiment. Of course, it should be noted that the options shown in Table 8 are set forth for illustrative purposes only, and thus should not be construed as limiting in any manner.

TABLE 8

| Option | Type | Default | Description |
|---|---|---|---|
| name | id | required | name of generated module |
| comment | string | undef | optional comment to display in the debugger (highly recommended) |
| arb | string | rr | arbitration algorithm if there is no Arb_Flow. rr is a simple round-robin algorithm without priorities and is the default. sp is a simple priority-based algorithm where iflow 0 has highest priority always, iflow 1 has next-highest priority always, etc. |
| Arb_Flow | flow | undef | separate arbitration flow; each arb iflow must have one field (any name) of width log2(input_iflow_count) |
| keep_hier | 0 or 1 | 0 | indicates that the output iflow will have a dummy "0" node added above it |
| raise_iflow | 0 or 1 | 0 | when keep_hier => 1 is specified, indicates that the output iflow level will be above the dummy "0" node |
| out_src_name | string | undef | if specified, each output iflow will contain a field with this name that holds the index of the selected input iflow |
| clk | id | global default | clock to use for this construct |
| stallable | 0 or 1 | global default | whether the construct is stallable |
| out_reg | 0 or 1 | global default | 0 or 1 indicating whether the output iflow is registered out |
| out_rdy_reg | 0 or 1 | global default | 0 or 1 indicating whether the output iflow's rdy signal is registered in; causes a skid flop to be added even if out_reg=0. |
| out_fifo | fifospec | 0 | a fifospec which is currently limited to a simple int representing depth of the fifo for the output iflow; out_reg and out_rdy_reg flops are after the fifo |

In one embodiment, the Select( ) construct may be the inverse of the Multicast( ) construct. The Select( ) construct may choose one iflow from multiple input iflows. For example, the Select( ) construct may act as an arbiter. In another embodiment, the Select( ) construct may perform a round-robin arbitration. In yet another embodiment, the Select( ) construct may allow for a user to supply an arbitration decision.

Additionally, in one embodiment, the Select( ) construct may occur at the level above the iflow level, (e.g., called the parent of the iflow level, etc.). In another embodiment, the parent may have numerically named children iflows 0, 1, etc. In yet another embodiment, if there are multiple parents, then an output iflow may be created for each parent's arbitration. Note that the Separate( ) and Merge( ) constructs can also operate above the iflow level, in which case, they are just wires. The Multicast( ) construct can work above the iflow level, so operations occur in parallel like Select( ).

Further, in one embodiment, if the stallable option is 1, then inputs may be stalled if the output is stalled. Also, if an Arb_Flow is supplied, then the Arb_Flow and the chosen input data flow may both arrive before either can be retired. Unchosen input iflows may be stalled. In another embodiment, if the stallable option is 0, an Atr_Flow may be used as an assertion check that the proper input flow is valid. That input may always be chosen. The output iflow may not be stalling when a chosen iflow is attempted to be transferred to it.

Further still, in one embodiment, the Select( ) construct may take in a superflow rather than a list of data flows. In another embodiment, an 'arb_code' option may exist that may allow a user to supply a code block including an arbiter. There may also be an aFlow method to register an arbiter code block by name so that other designers may use them easily (e.g., arb=>"name", etc.). In this way, the system itself may not need to implement any arbiter.

Also, in one embodiment, the one or more control constructs may include a Connect( ) construct. For example, a deferred input may not be a primary input. Instead, the deferred input may be part of a circular design. For example, it may go into the top of a contrived pipeline, then come out the bottom. The Connect( ) construct may be used to connect the bottom to the deferred data flow at the top. In this way, the data flows may become the same, thus completing the circle.

In addition, in one embodiment, the one or more control constructs may include an As( ) construct. For example, the As( ) construct may be used to map iflow data to a completely different packet format. The As( ) construct may be used both inside and outside of a code block. In another embodiment, a user may pass a width to get a simple flattened Uint( ) leaf result, or the user may pass anything that can be passed to aFlow->Clone( ), including a name=>width list as shown above, or another active or inactive data flow to use as a template.

Furthermore, in one embodiment, $Flow->As_Bits( ) may include shorthand for $Flow->As($Flow->width( )). It may flatten out $Flow to the same number of raw bits. In another embodiment, if the input data flow has multiple iflows, then the template may be applied to each iflow. In yet another embodiment, the As( ) construct may not be used to modify data flows above the iflow level. Note that inside a code block, the input data flow may not denote multiple iflows. In still another embodiment, if the template is larger than the input iflow, then the result may be zero-extended, and if the template is smaller than the input iflow, then the result may be truncated. In another embodiment, after this operation is performed, the template may not be modified in any way.

Further, in one embodiment, the one or more control constructs may include a Shuffle( ) construct. For example, the Shuffle( ) construct may be used to rearrange data flows above the iflow level. This may result in pure wiring and no logic. In another embodiment, constructs such as Shuffle( ), Select( ), and Multicast( ) may be used to manipulate data flows above the iflow level. In still another embodiment, the Shuffle( ) construct may support a transpose operation.

Table 9 illustrates the options associated with a Shuffle( ) construct, in accordance with one embodiment. Of course, it should be noted that the options shown in Table 9 are set forth for illustrative purposes only, and thus should not be construed as limiting in any manner.

TABLE 9

| Option | Type | Default | Description |
|---|---|---|---|
| name | id | required | name of generated module |
| comment | string | undef | optional comment to display in the debugger (highly recommended) |
| op | string | transpose | the type of shuffle operation; only transpose is supported, so there is no point in ever supplying this option |
| level | string | iflow | child level at which to perform shuffle; there must be two levels available above this level |
| clk | id | global default | clock to use for this construct |

The inputs of a crossbar switch may be shuffled to the outputs of the switch. For example, the data flow may have at least two levels above the iflow level. In another example, a grandfather level may be at the top, with a parent level at level 1, and an iflow level at level 0. There may be 5 parents, each with 2 child iflows. After transposing via a Shuffle( ) construct, the output data flow may have 2 parents, each with 5 child iflows, one taken from each of the input parents. In this way, output parent 0 may have child iflow 0 from each of the 5 input parents, and output parent 1 may have child iflow 1 from each of the 5 input parents.

Further still, in one embodiment, the one or more control constructs may include a Derive_Clock( ) construct. For example, the Derive_Clock( ) construct may be used to create a new clock from an existing clock from_clk "clk". In another embodiment, Disable_Flow may disable the new clock when Disable_Flow( )->Valid( ).

Table 10 illustrates the options associated with a Derive_Clock( ) construct, in accordance with one embodiment. Of course, it should be noted that the options shown in Table 10 are set forth for illustrative purposes only, and thus should not be construed as limiting in any manner.

TABLE 10

| Option | Type | Default | Description |
| --- | --- | --- | --- |
| name | id | required | name of new clock |
| comment | string | undef | optional comment to display in the debugger (highly recommended) |
| from_clk | id | global default | clock from which this new clock is derived; may be a primary or derived clock |
| Disable_Flow | flow | undef | optional empty flow that indicates when to disable the new clock |

In another embodiment, clock dividers, Enable_Flow, and other resets may be supported.

In this way, clocking, clock gating, and data flow control may be regulated automatically during the creation of the integrated circuit design, utilizing the hardware development language that is embedded in a scripting language 208. Additionally, the hardware development language may include high level built in control constructs that may be guaranteed to work and that may deal in terms of data flows. These control constructs may also be reused.

Further, the embedded hardware development language may incorporate validation and verification tests and may allow for automatic bottom up formal verification. Further still, the embedded hardware description language may be flexible and configurable, and may be compatible with a variety of programming languages (e.g., Verilog®, C++, CUDA™, etc.). Also, the embedded hardware development language may allow for debugging and visualization. For example, users may be taken to the earliest assertion failure within code, and signals may be automatically grouped.

Compute Constructs

The compute construct may include an entity (e.g., a module, etc.), implemented as part of a hardware description language, that receives one or more data flows as input and creates one or more output data flows, based on the one or more input data flows. The compute construct may include a tree function, (e.g., a function that is passed the plurality of data values and the callback function, etc.), which, in configured to apply a callback function to a plurality of data values utilizing a processor.

Further, in one embodiment, the tree function may be utilized by another function. For example, the tree function may be utilized by a Min( ) function that returns a minimum value from a hierarchical flow with multiple numerically named subflows. In another example, the tree function may be utilized by a Max( ) function that returns a maximum value from a hierarchical flow with multiple numerically named subflows. In yet another example, the tree function may be utilized by a Prio_Min( ) function that returns a minimum priority value from a numerical hierarchy flow containing priority values. In still another example, the tree function may be utilized by a Prio_Max( ) function that returns a maximum priority value from a numerical hierarchy flow containing priority values.

Further still, in one embodiment, the tree function may be utilized by a scatter-gather function. In another embodiment, the other function utilizing the tree function may be included within a compute construct. In this way, the tree function may provide an organized framework for enabling tree-structured combinatorial algorithms and associated functions.

Additionally, an N-ary function may be input by the user into a subroutine of a programming language used to draft code associated with the compute construct. In still another embodiment, the N-ary function may be created and stored, and the identification of the N-ary function may include a reference to the stored N-ary function. The N-ary function may include a function that has N significant conditions, where N is a positive integer greater than one. In another embodiment, the identification of the N-ary function may be performed by a user, utilizing a code block. For example, the identified N-ary function may be called within a general purpose code block, where such code block may include hardware design statements mixed with scripting language statements.

Further, in one embodiment, the identified N-ary function may include code that is implemented during synthesis or during simulation. In another embodiment, the identified N-ary function may be received in association with standard scripting language code. For example, the identified N-ary function may be included within one or more hardware code components that are interspersed with one or more standard scripting language statements (e.g., Perl statements, etc.).

The code block provided by the user containing the identification of the N-ary function may be used to create the control construct, such that the compute construct includes the N-ary function. In another embodiment, the compute construct may include an entity (e.g., a module, etc.), implemented as part of a hardware description language, that receives one or more data flows as input, where each data flow may represent a flow of data.

One or more activated data flows may be received by the compute construct, the compute construct may be configured to perform operations using the one or more activated data flows, and one or more output data flows may be output from the compute construct. In another embodiment, the N-ary function may include a tree-based logN combinational function. For example, the N-ary function may include a tree function (e.g., Tree( ), etc.) that performs a bottom-up, recursive traversal of data when the hardware design is built, i.e., translated by the translator 215. For example, a numerical hierarchical flow with N subflows named 0 . . . N-1 may be passed to the tree function, where each subflow may form the leaves of the tree. In another example, a leaf flow (e.g., raw bits, etc.) may be passed to the tree function, in which case the individual bits may be treated as the leaves of the tree.

Further, in one embodiment, a callback function may also be passed to the tree function. For example, for each node in the tree of logic, the tree function may call the callback function. In another embodiment, the tree may be binary, but an optional argument may be passed to the tree function that specifies a different N-ary-ness, (e.g., 3, 4, etc.). This may be used by the tree function to group nodes in each callback.

In one example, N-ary may equal 2. Additionally, in the first iteration, each callback instance of the callback function may be passed these arguments: the current level in the tree (0 for first iteration), the starting leaf index in the original flow (0, 2, 4, etc.), the number of original leaves covered by the call (2 for level 0), and up to 2 outputs from the previous level of the tree (which will be the leaves for level 0). In one embodiment, if the original flow does not have an even number of leaves, then the last callback may not cover 2 leaves.

Further still, within the tree function, during the next iteration (e.g., the next level up, level 1), a callback may be made with starting leaf index 0 and count 4, then with starting index 4 and count 4, etc. Additionally, the return values from each pair of adjacent callbacks from level 0 may be passed as arguments for this level 1 callback. The final iteration may be performed at the final level (e.g., level log 2(N)−1) which may contain one callback with 2 lower-level inputs and which may produce the final output. In another embodiment, a user may control the return value of the callback. For example, the return value may be a data flow, a hash of multiple pieces of information about each partial iteration result a hash of per-node iteration information, etc.

Also, in one embodiment, starting with the leaf level which is deemed level 0, the callback function may be called with these arguments: the current tree level, the starting leaf index in the original input data flow, the number of original leaves covered by this call, and up to "N-ary" outputs from the previous stage in the tree. For the first-level calls to the callback function, up to "N-ary" leaf subflows may be passed as the inputs. The callback function may then return a single scalar entity. For the second-level calls to the callback function, the inputs may be the return values from the first-level callbacks, and the tree function may complete when it has only one callback return value left to work on, which may be returned as the result.

Additionally, in one embodiment, the N-ary function may include a function that utilizes the tree function. For example, the N-ary function may include a minimum function (e.g., Min( )) that receives a hierarchical flow with multiple numerically named subflows and returns the minimum value using the tree function. In another example, the N-ary function may include a maximum function (e.g., Max( )) that receives a hierarchical flow with multiple numerically named subflows and returns the maximum value using the tree function.

Further, in one embodiment, the N-ary function may include a priority minimum function (e.g., Prio_Min( )) that receives a numerical hierarchy flow containing priority values of any width, or a data flow that is a raw bitmask where each bit represents priority 0 or 1. The priority minimum function may also receive an argument representing the index of the subflow that should take precedence if there are ties in the priority values. The priority minimum function may use the tree function to find the minimum priority and may return the index of the subflow (leaf) holding that priority value.

Further still, in one embodiment, the N-ary function may include a priority maximum function (e.g., Prio_Max( )) that receives a numerical hierarchy flow containing priority values of any width, or a data flow that is a raw bitmask where each bit represents priority 0 or 1. The priority maximum function may also receive an argument representing the index of the subflow that should take precedence if there are ties in the priority values. The priority maximum function may use the tree function to find the maximum priority and may return the index of the subflow (leaf) holding that priority value. In one embodiment, the priority minimum function and/or the priority maximum function may be used to construct a priority-based round-robin arbiter.

Also, in one embodiment, the N-ary function may include a scatter/gather function that utilizes the tree function. For example, the N-ary function may include a gathered function (e.g., Gathered( )) that receives a scattered data flow with N valid subflows and a corresponding sparse bitmask of valid indexes, then collapses the M valid subflows down into a data flow where contiguous indexes 0 . . . M−1 contain the data. In another example, the N-ary function may include a gathered indexes function (e.g., Gathered_Indexes( )) that returns the actual gathered indexes as the resultant gathered data.

In addition, in one embodiment, the N-ary function may include a scattered index function (e.g., Scattered_Index( )) that receives a valid mask of scattered values and a gathered index, then returns the scattered index corresponding to what its gathered index would be. In another embodiment, the N-ary function may include a gathered index function (e.g., Gathered_Index( )) that receives a valid mask of scattered values and a scattered index, and returns the gathered index corresponding to that scattered index.

Further, in one embodiment, the N-ary function may include a scatter/gather function that does not utilize the tree function. For example, the N-ary function may include a scattered function (e.g., Scattered( )) that receives a pair of associated data flows, one containing M subflows of data with indexes 0 . . . M−1; and another data flow containing the target scatter indexes of those data where the maximum index is N−1. The scattered function may then returns a data flow with N subflows holding the scattered data from the input data flow. For un-scattered indexes, the data may be undefined. In another embodiment, the scattered function may return a bitmask denoting which indexes in the scattered result are valid. In another example, the N-ary function may include a scattered indexes function (e.g., Scattered_Indexes( )) that calls the scattered function with the received indexes' data flow also as the data flow. In this way, the indexes themselves may be scattered.

Further, in one embodiment, the compute construct may be incorporated into the integrated circuit design in association with the one or more data flows. In one embodiment, the one or more data flows may be passed into the compute construct, where they may be checked by the translator 211. In another embodiment, errors may be immediately found and the design script may be killed immediately upon finding an error. In this way, a user may avoid reviewing a large amount of propagated errors. In yet another embodiment, the compute construct may check that each input data flow is an output data flow from some other construct or is what is called a deferred output.

Translation into a Source Database

In one embodiment, the translation process implemented by the translator 211 generally does not perform optimization and instead identifies and reports any errors (e.g., build errors) in the design. The data flows and constructs are translated into the graph-based intermediate representation of the design 210. Consequently, the translation of a hardware design may be performed very quickly, in a matter of a few seconds for even a complex unit design. During translation of the hardware design by the translator 211, each data flow and construct may be analyzed, and, if an error is found, the translator 211 may halt immediately and report an error and/or may complete the analysis and generate an error report. In this way, errors within the hardware design may be determined immediately and may not be propagated during the execution of the hardware design and found at the end of hardware construction or during the running of a suspicious language flagging program (e.g., a lint program) on the hardware construction.

A hardware design that is successfully processed by the translator 211 without errors should build successfully with no lint errors when processed by the translators 215, 220, and 222. Additionally, the user may use a debugger application to browse the source database 212 for a hardware design examine the hardware design before processing the source database 212 using the translator 215.

As data flows are constructed, nodes are created in a node graph for each subflow in the data flow hierarchy. Specifically, each aFlow class object (e.g., data flow) represents a single node in the node graph. All types of data flows, whether the particular data flow is a leaf unsigned integer, constant, hierarchical data flow, State variable, input, or output follows the same conventions for construction and manipulation. In one embodiment the aFlow class is implemented as a tied hash. A hash is essentially tied to each corresponding node in the node graph.

As each control and compute construct is created, corresponding nodes are also added to a node graph. A hash is associated with each node in the node graph that corresponds to a control or compute construct. The first part of the translation process is to generate the nodes and associate each node with a hash. In one embodiment, the user cannot directly access the construct nodes, but can access the data flows nodes that are between construct nodes. Following translation, each data flow node (except for primary input and output data flow nodes) has a pointer to a source construct node and a destination construct node. Primary input data flow nodes have a pointer to a destination construct node and primary output data flow nodes have a pointer to a source construct node. In one embodiment, the translator 211 attaches the scripting language call stack to each node corresponding to a data flow or construct so that error messages and the debugger can help the user figure out where various language constructs were created in user code.

Figure 3B:
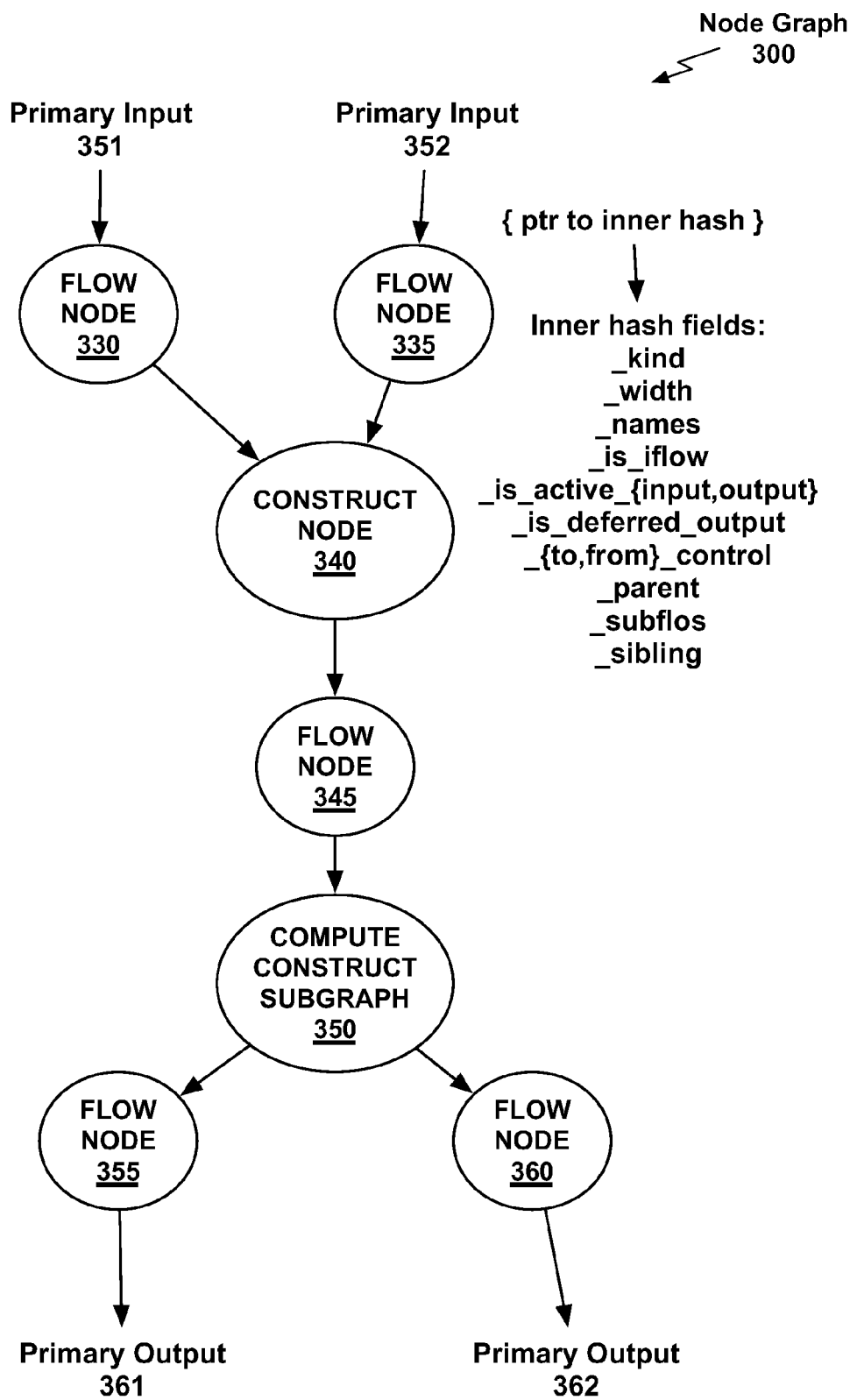
FIG. 3B shows a node graph representation of a hardware design encoded as data flows, control constructs, and a compute construct, in accordance with one embodiment.

FIG. 3B shows a node graph representation 300 of a hardware design encoded as data flows, control constructs, and a compute construct, in accordance with one embodiment. Design_Create( ) creates a graph node for the design as a whole. Design_Create( ) also records a list of all constructs in the order in which they were constructed and records a list of data flows in the order in which they were constructed. The translator 211 translates the hardware design, determining connectivity of the nodes in the node graph to generate a graph-based intermediate representation of the hardware design. A node graph is an example of a graph-based intermediate representation of the hardware design.

Each data flow is associated with a tied hash that specifies various fields that are specific to the data flow and that correspond to options selected by the user. One field is a pointer to an inner hash. A variety of fields may be specified by the inner hash of each flow node. The fields in the inner hash are used by the translator 211 and cannot be accessed by users. Examples of the fields include _kind which defines the data flow kind (e.g., leaf, hierarchical, array), _width which is the bit width of the data flow, _names which is an anonymous array of names provided by the user in the order in which the names were provided, _is_iflow which indicates if the data flow node is an interface data flow node, _is_active_{input, output} which indicates if the data flow node is an active input and/or output of a construct, _is_deferred_output which indicates that the data flow node can be used as active input, but the output not yet known, _{to,from}_control which specifies the control construct node to/from which the data flow is attached, _parent which specifies the parent flow if the data flow is a sub-flow of a hierarchical data flow, _subflows which specifies the child data flows of the data flow, and _sibling which specifies sibling data flows of the data flow (i.e., data flows having the same parent). The fields of the inner hash may be used by the translator 211 to determine the connectivity of the nodes, i.e, connections between the nodes.

Each construct is also associated with a tied hash that specifies various fields that are specific to the construct and that correspond to construct-specific options selected by the user. One field is a pointer to an inner hash. A variety of fields may be specified by the inner hash of each construct node. Examples of the fields include _out_fifo which specifies an array of FIFOs for each output iflow list, _out_rdy_reg which specifies an array of 0/1 used for each output iflow list, _out_reg which specifies an array of 0/1 used for each output iflow list.

For example, the Separate( ) construct has one iflow in each input iflow list and each output iflow list typically has multiple iflows. In one embodiment, the number of input and output iflow lists is the same and each set of lists is associated with a different module instance, so the Separate( ) operation is performed in parallel for a superflow. The Multicast( ) construct is similar, except that there may be an additional input iflow per list if the unicast_dest or multicast_destmask is provided form a separate data flow. For the Merge( ) construct each input iflow list typically has multiple iflows and each output iflow list has one iflow. The Select( ) construct is similar, but each input iflow list may have an additional arb_flow (arbitration) iflow.

Each input iflow list of the compute( ) construct can have multiple iflows and each output iflow list may have multiple iflows. An output iflow list and state flip-flops are constructed for each input iflow list. The compute( ) construct calls back the code block as an anonymous subroutine for each set of iflow lists and the state. The code block may perform a different operation for each callback, but typically the code block performs the same operation. The code block is elaborated by the translator 211 and the elaborated code block is stored in a list for the compute construct. Duplicated code blocks are identified later to remove redundancy.

As shown in FIG. 3B, the translator 211 may be configured to generate the flow nodes 330, 335, 345, 355, and 360. The flow node 330 is coupled between the primary input 351 and the construct node 340. The flow nodes 330 will therefore each specify _to_control as the construct node 340 in the respective inner hash fields. Similarly, the flow node 345 will therefore specify the field _from_control as the construct node 340 and the field _to_control as the compute construct subgraph 350. The flow nodes 355 and 360 will each specify _from_control as the compute construct subgraph node 350 in the respective inner hash fields.

Figure 4:
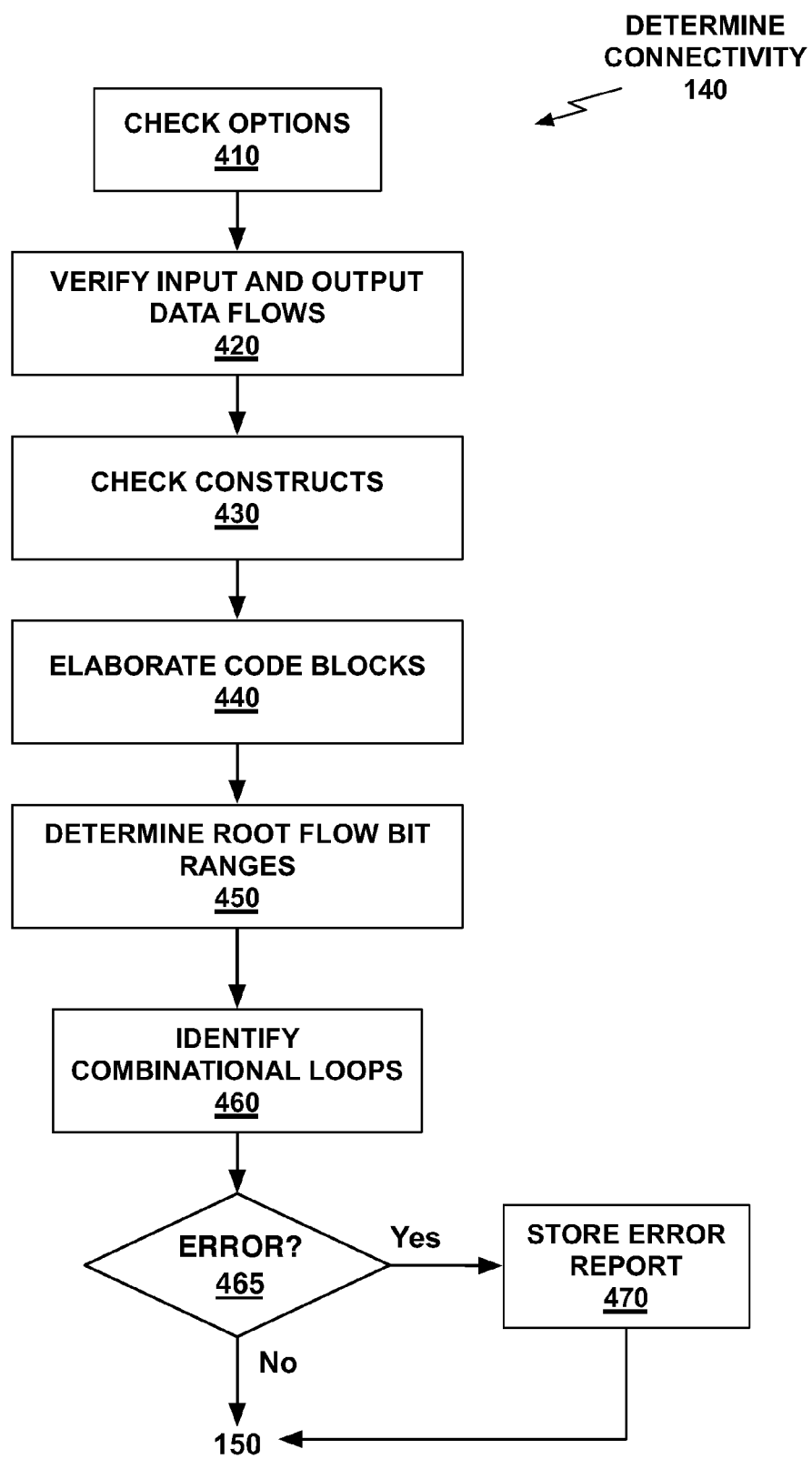
FIG. 4 shows a method for building an integrated circuit using data flows and constructs, in accordance with another embodiment.

FIG. 4 shows a method 400 for translating a design using data flows and constructs, in accordance with one embodiment. As an option, the method 400 may be carried out in the context of the functionality of FIGS. 1, 2, 3A, and 3B. Of course, however, the method 400 may be implemented in any desired environment. It should also be noted that the aforementioned definitions may apply during the present description.

The user signals the end of the design by calling Design_Save( ). Because designs are typically for entire units, the user may be required to supply a hash of top-level I/O flows. Design_Create( ) had already created a design graph node for the design as a whole, and recorded the list of all constructs in the order in which they were created. Data flows are similarly recorded. Design_Create( ) also generated a canonical list of input iflows and lists of output iflows for each construct. The hash for each construct is added to a global list for the design graph node. The global list is traversed by the translator 211.

When Design_Save( ) is called, as shown in operation 410, the translator 211 executes a checking routine called check_options( ). Each construct takes a set of name=>value argument pairs and the construct supplies the expected "type" for each argument as well as default values for optional constructs. A majority of user errors can be detected by the check_options( ) routine. User-written language extensions and generators also have access to check_options( ) for identifying errors.

As shown in operation 420, the translator 211 examines the top data flows to confirm that they are either a deferred output that is not an active output (i.e., a primary input) or an active output that is not an active input (i.e., a primary output). The translator 211 then starts with the primary input data flows and traverses the design while performing connectivity checks for each data flow. Each flow is marked as "seen" when it is traversed and a list of deferred output data flows is constructed and checked to confirm that every deferred output flow was consumed as an active input flow.

The translator 211 examines all of the constructs and data flows and makes sure that all created data flows are both active inputs and active outputs of constructs. Each construct creates one or more output data flows, each of which are marked as is_active_output=1 and is_active_input=0. Any input iflows must be marked as is_active_output=1 or is_deferred_output=1 and is_active_input=0 (unless the input iflow is an inactive input that is composed entirely of constants). In one embodiment, active outputs that are still marked as deferred outputs must be primary inputs to the design and must be listed in the user's I/O hash. In one embodiment, data flows that are not active outputs must be primary outputs and must be listed in the user's I/O hash. All code block combinational data flows must read at least once, though not all of the bits of a data flow need to be used.

Design_Inst( ) is used to instantiate a sub-design. The sub-design may include one or more data flows and/or constructs. The translator 211 may automatically build the sub-design if its source database does not exist or is out of date. The user passes a hash of input/output data flows to Design_Inst( ) and the translator 211 checks and records that the input/output data flows match the top-level flow names and structures expected. Design_Inst( ) also has a repetition count for instantiating multiple copies of a design. Design_Inst( ) may be configured to return an array of hashes instead of a single hash when a count is not provided. Alternatively, the user may pass a single hash where each element is an array.

Different constructs can be configured to operate on different levels of input data flows or superflows. There are various helper functions for finding all subflows at a particular level in the hierarchy (e.g., level 0 is the root or top of the data flow hierarchy). Other helper routines are used to ensure that said subflows are actually interface data flows where it's required (e.g., Select( )). These helper routines may be used by the translator 211 to identify the various data flows in the design. As previously explained, each construct produces a canonical list of related input interface data flows (i.e., iflows). Some constructs have only one list; others have only one iflow per list, but multiple lists; still other constructs have multiple lists each of which could have multiple iflows. All constructs may need to process superflows, which means that they must process sets of iflows in parallel. This is why there are lists of lists of iflows for inputs and outputs. Regardless, the format of these lists is the same for all constructs, which enables more efficient and maintainable processing by the translators 215, 220, and 222.

The construction of output data flows and output iflows within each output data flow may be construct dependent. There are some helper routines to help construct parts of the output flow structures that can be expressed in a common way (e.g., all structure above iflows). Below the iflow level, however, the contents typically need to be constructed differently for each type of construct. When a construct is created a canonical list of lists of output iflows is generated that is similar to that described earlier for inputs.

As shown in operation 420, the translator 211 checks that input data flows for each construct are outputs or deferred outputs, and are not already active inputs to some other constructs. The translator 211 may use helper routines to mark the input data flows as active inputs (so other the input data flow may not be provided as an input to another construct), and output data flows are marked as active outputs, which allows the output data flows to be used as inputs to subsequent constructs.

In another embodiment, the translator 211 may analyze the data flow input to the construct and determine whether the data flow is an output flow from another construct or a deferred output (e.g., a data flow that is a primary design input, a data flow that will be later connected to an output of a construct, etc.). In this way, the translator 211 may confirm that the input data flow is an active output.

Most constructs have specific rules about the format of constructs. For example, Select( ) requires that all input iflows are part of a numeric hierarchy flow, and that they are all structurally equivalent. There are various flow introspection functions—also available to the user—that may be used by the translator 211 to perform many of these construct format checks. As shown in operation 420, the translator 211 checks the format of each construct. The translator 211 may also check the out_fifo, out_reg, and out_rdy_reg options, and attach these options to the construct node inner hash field.

As the translator 211 checks various aspects of the representation of the design, the functions of the control constructs are generated the translator 211. The translator 211 records the iflows and parameters, then writes the source database 212. Generation of control construct functions may be performed by the translator 215—after the translator 211 has detected any design entry errors.

As previously described and as shown in operation 420, the translator 211 also elaborates code blocks within the Compute( ) constructs. As shown in operation 440, the translator 211 elaborates the code blocks. For each set of input iflows (included in the iflow lists), a single set of output iflows and a set of State flows is passed by the translator 211 to the code block subroutine. As stated before, the subroutine is called for each set of iflows. The translator 211 saves the expressions and statements that are included in the subroutine in an analogous subgraph, such as the compute construct subgraph 350 shown in FIG. 3B. The translator 211 allows each call of the subroutine to produce a potentially different set of code logic, thus a separate subgraph is produced for each code block invocation. The translator 211 allows input iflow packets and State values to be referenced as many times as desired inside the code block. Output iflow subflows may be written (field by field if desired), but never read. Output and State subflows may be written within multiple places within the code block, but the translator 215 may be configured to generate an assertion that each bit is written only once during any given cycle.

The translator 211 identifies an error when a combinational expression flow is created and not used. A combinational expression flow is any expression whose ultimate inputs are input iflow fields, state fields, or the like. The combinational expression flow is a temporary flow within the compute construct and is not an output flow.

Operators and built-in functions used in a code block fall into different categories: unary, binary, ternary, and nary depending on the number of arguments. Each of these categories has 1, 2, 3, or variable number of operands the operands are named, e.g., opnd0, opnd1, etc. to maintain consistency. The translator 211 also records the operator. In one embodiment, the translator 211 performs an optimization by folding operators into constants when the operands lend themselves to that. For example 0 && $Flow always evaluates to 0, so the binary node may be marked as a constant with value 0, but the operands are still recorded for the high-level GUI waveform debugger 236. Later the translator 215 will use this constant rather than emitting logic for the operands.

In one embodiment, the translator 211 may use a scope stack during code block elaboration. A hash corresponding to the code block is pushed onto the scope stack when the code block is entered. The scope stack enables the tracking of hardware statements and expressions to ensure that hardware statements and expressions are not used outside of a code block in which they are defined. The scope stack may also be used to ensure that other constructs are not invoked within a code block and that a data flow created outside of the code block is not referenced inside the code block (except for a data flow that is constant).

The scope stack may also be used by the translator 211 to traverse if-elsif-else-endif statements in code blocks. The translator 211 pushes an If on the scope stack. When the translator 211 reaches an Elsif/Else statement, the translator 211 first makes sure that the top item on the scope stack is an If or Elsif, and then the translator 211 removes that If/Elsif and pushes the new Elsif/Else. Endif is treated similarly to Elsif/Else, but the translator 211 does not push anything back onto the scope stack. At the end of the code block, the top thing on the scope stack must be the code block itself, so a missing Endif statement will be caught by the translator 211. Note that in one embodiment, If and Elsif expressions must be 1-bit-wide. Also, If/Elsif/Else do not create a new lexical scope, allowing Perl if, for, etc. to be wrapped around parts of If clauses so that the HDL If, For( ), etc. commands can be laid down programmatically. However, inner statements are created as children of the Then or Else.

The translator 211 may be configured to traverse a given-when-default-endgiven statement in a manner similar to the if-elsif-else-endif statement. When is handled similarly to elsif, default is handled similarly to else, and EndGiven is handled similarly to Endif. No new lexical scope is created, but inner statements are created as children of the Do or Default statement. For, While, and Forever statements are also pushed onto the scope stack by the translator 211 and no new lexical scope is created, but inner statements are created as children of the Do or Forever statement. EndFor/EndWhile/EndForever causes the top For/While/Forever to be checked and popped by the translator 211.

As shown in operation 450, the translator 211 may determine the bitrange in terms of msb:lsb of a root flow referred to by a bitslice or index for an iflow. The root flow is an enclosing iflow or state variable. In cases where the index is not a constant (which is allowed), the msb:lsb is unknown, but the root flow can still be recorded and used by the translator 215 to construct a case statement based on the index.

As shown in operation 460, the translator 211 may also check that there are no combinational loops in the design. In one embodiment, this is accomplished using a traditional graph-cycle-detection algorithm. First, the algorithm is applied at the construct level in a conservative way. Note that out_reg breaks combinational loops at the construct level. This initial step eliminates all data flows that can't possibly be involved in a combinational loop. For the remaining flows, the translator 211 must look inside the constructs, possibly at the bitrange level to see if the coarsely evaluated combinational loops are really combinational loops. For example, an iflow may enter a construct but the iflow may get assigned immediately to a State register, which terminates the loop. The translator 211 records all combinational loop paths in a canonical report format that can by read into the high-level GUI waveform debugger 236 for easier analysis of the identified paths.

As shown in operation 465, the translator 211 determines if any errors have been detected in the design, and, if so, at operation 470 an error report is stored at operation 470. The translator 211 also writes out the graph-based intermediate representation of the design to the source database 212 at operation 150. At operation 365, when the translator 211 has ensured that the connectivity is correct and there are no errors to report, the translator 211 writes out the graph-based intermediate representation of the design to the source database 212 at operation 150. When the translator 211 has successfully completed, the translator 215 should succeed without any build errors.

The format of the source database 212 may be a nested Perl data structure with anonymous hashes, anonymous arrays, and scalars. The inner hashes are saved, but the outer hashes are discarded, so that the graph-based intermediate representation of the design 210 is a graph of nodes and corresponding hashes with any data flow references changed to point to inner hashes.

Figure 5:
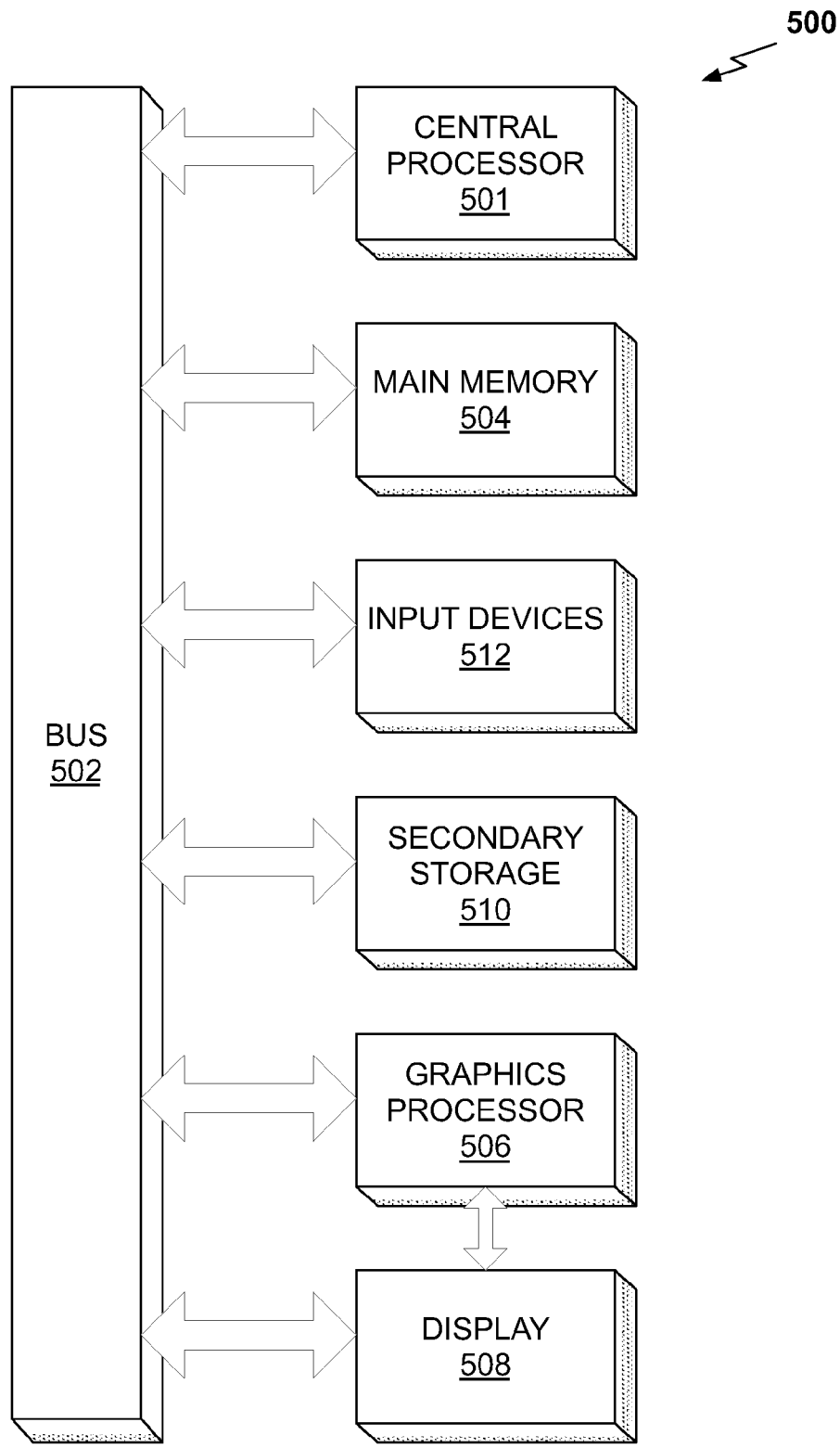
FIG. 5 illustrates an exemplary system in which the various architecture and/or functionality of the various previous embodiments may be implemented.

FIG. 5 illustrates an exemplary system 500 in which the various architecture and/or functionality of the various previous embodiments may be implemented. As shown, a system 500 is provided including at least one host processor 501 which is connected to a communication bus 502. The communication bus 502 may be implemented using any suitable protocol, such as PCI (Peripheral Component Interconnect), PCI-Express, AGP (Accelerated Graphics Port), HyperTransport, or any other bus or point-to-point communication protocol(s). The system 500 also includes a main memory 504. Control logic (software) and data are stored in the main memory 504 which may take the form of random access memory (RAM).

The system 500 also includes input devices 512, a graphics processor 506 and a display 508, i.e. a conventional CRT (cathode ray tube), LCD (liquid crystal display), LED (light emitting diode), plasma display or the like. User input may be received from the input devices 512, e.g., keyboard, mouse, touchpad, microphone, and the like. In one embodiment, the graphics processor 506 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user. The system may also be realized by reconfigurable logic which may include (but is not restricted to) field programmable gate arrays (FPGAs).

The system 500 may also include a secondary storage 510. The secondary storage 510 includes, for example, a hard disk drive and/or a removable storage drive, representing a floppy disk drive, a magnetic tape drive, a compact disk drive, digital versatile disk (DVD) drive, recording device, universal serial bus (USB) flash memory, etc. The removable storage drive reads from and/or writes to a removable storage unit in a well-known manner.

Computer programs, or computer control logic algorithms, may be stored in the main memory 504 and/or the secondary storage 510. Such computer programs, when executed, enable the system 500 to perform various functions. Memory 504, storage 510 and/or any other storage are possible examples of computer-readable media.

In one embodiment, the architecture and/or functionality of the various previous figures may be implemented in the context of the host processor 501, graphics processor 506, an integrated circuit (not shown) that is capable of at least a portion of the capabilities of both the host processor 501 and the graphics processor 506, a chipset (i.e. a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 500 may take the form of a desktop computer, laptop computer, server, workstation, game consoles, embedded system, and/or any other type of logic. Still yet, the system 500 may take the form of various other devices m including, but not limited to a personal digital assistant (PDA) device, a mobile phone device, a television, etc.

Further, while not shown, the system 500 may be coupled to a network [e.g. a telecommunications network, local area network (LAN), wireless network, wide area network (WAN) such as the Internet, peer-to-peer network, cable network, etc.) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A computer program product embodied on a non-transitory computer readable medium, comprising:
    code for receiving an integrated circuit hardware design encoded as one or more data flows, each representing a flow of data through the integrated circuit hardware design, and one or more control constructs configured to perform data steering operations that create one or more output data flows based on one or more input data flows, wherein a first data flow includes a superflow that includes multiple interface flows, each interface flow representing an interface with independent flow control;
    code for generating a node for each data flow of the one or more data flows;
    code for generating a node for each control construct of the one or more control constructs;
    code for determining connectivity of the nodes to generate a graph-based intermediate representation of the integrated circuit hardware design; and
    storing the graph-based intermediate representation of the integrated circuit hardware design in a source database.

2. The computer program product of claim 1, wherein each of the one or more data flows is associated with one or more interfaces of the integrated circuit hardware design.

3. The computer program product of claim 1, further comprising code for traversing the one or more data flows to identify a primary input flow that is an active output.

4. The computer program product of claim 1, further comprising code for traversing the one or more data flows to identify a primary input flow that is marked as a deferred output and an active input.

5. The computer program product of claim 1, further comprising code for traversing the one or more data flows to identify an output flow marked as an active output and not an active input.

6. The computer program product of claim 1, wherein each node for a data flow includes a pointer to a first node corresponding to a source construct and a second node corresponding to a destination construct.

7. The computer program product of claim 1, further comprising code for generating a node for a compute construct, wherein the computer program product is operable to callback to a code block within the compute construct for an input superflow that is passed into the compute construct, the superflow including multiple interface flows, each interface flow representing an interface with independent flow control.

8. The computer program product of claim 1, further comprising code for traversing a code block using a scope stack.

9. The computer program product of claim 1, wherein a first data flow includes a superflow that includes multiple interface flows, each interface flow representing an interface with independent flow control, and the computer program product is operable such that one or more of the control constructs performs automatic looping on each interface flow.

10. The computer program product of claim 1, further comprising code for determining a bitrange of a root flow referred to by a bitslice or index for the one or more data flows.

11. The computer program product of claim 1, wherein a first control construct of the one or more of the control constructs includes a module implemented as part of a hardware description language that receives at a first data flow of the one or more data flows as an input.

12. The computer program product of claim 1, wherein a first control construct of the one or more of the control constructs is a separate construct that creates multiple output data flows from a single input data flow.

13. A method, comprising:
    receiving an integrated circuit hardware design encoded as one or more data flows and one or more control constructs configured to perform data steering and data storage operations that create one or more output data flows based on one or more input data flows, wherein a first data flow includes a superflow that includes multiple interface flows, each interface flow representing an interface with independent flow control;
    generating, by a processor, a node for each data flow of the one or more data flows;
    generating, by the processor, a node for each control construct of the one or more control constructs;
    determining, by the processor, connectivity of the nodes to generate a graph-based intermediate representation of the integrated circuit hardware design; and storing the graph-based intermediate representation of the integrated circuit hardware design in a source database.

14. A system, comprising:
a processor for receiving an integrated circuit hardware design encoded as one or more data flows and one or more control constructs configured to perform data steering and data storage operations that create one or more output data flows based on one or more input data flows, wherein a first data flow includes a superflow that includes multiple interface flows, each interface flow representing an interface with independent flow control;
wherein the processor is configured to:
generate a node for each data flow of the one or more data flows,
generate a node for each control construct of the one or more control constructs, and
determine connectivity of the nodes to generate a graph-based intermediate representation of the integrated circuit hardware design; and
a memory that is coupled to the processor and configured to store the graph-based intermediate representation of the integrated circuit hardware design in a source database.

15. The method of claim 1, wherein a first control construct of the one or more of the control constructs is a merge construct that creates a single output data flow from multiple input data flows.

16. The method of claim 1, wherein a first control construct of the one or more of the control constructs is a multicast construct that sends a single input data flow to multiple output data flows.

17. The method of claim 1, a first control construct of the one or more of the control constructs is a select construct that accepts multiple input data flows and selects one of them to be an output data flow.

18. The method of claim 1, a first control construct of the one or more of the control constructs is an as construct that maps flow data to a different format.

19. The method of claim 1, a first control construct of the one or more of the control constructs is a shuffle construct that rearranges a structuring of input data flows.

20. The method of claim 1, a first control construct of the one or more of the control constructs is a derive clock construct that creates a new clock from an existing clock.

* * * * *